(12) United States Patent
Kamiyama et al.

(10) Patent No.: US 9,018,573 B2
(45) Date of Patent: Apr. 28, 2015

(54) SOLID-STATE IMAGE SENSING DEVICE WITH A CHANGE-OVER SWITCH

(75) Inventors: Tomoyuki Kamiyama, Wako (JP); Keisuke Korekado, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 572 days.

(21) Appl. No.: 13/435,406

(22) Filed: Mar. 30, 2012

(65) Prior Publication Data
US 2012/0248290 A1 Oct. 4, 2012

(30) Foreign Application Priority Data
Mar. 31, 2011 (JP) .................. 2011-081327

(51) Int. Cl.
*H03K 17/78* (2006.01)
*H01L 27/00* (2006.01)
(Continued)

(52) U.S. Cl.
CPC .... *H01L 27/14812* (2013.01); *H01L 27/14831* (2013.01); *H04N 5/353* (2013.01); *H04N 5/37452* (2013.01)

(58) Field of Classification Search
CPC ..... H01L 27/14; H01L 27/142; H01L 27/144; H01L 27/14643; H01L 27/14645; H01L 27/14649; H01L 27/148; H01L 27/14806; H01L 27/14825; H01L 27/14831; H01L 27/14837; H01L 27/14843
USPC ................. 250/208.1, 214 SW, 214 R, 214.1; 348/162, 164, 166, 207.99, 272, 274, 348/275, 277–283, 294–324, 332; 257/414, 257/428, 431, 440–466
See application file for complete search history.

(56) References Cited

U.S. PATENT DOCUMENTS 5,804,868 A 9/1998 Kobayashi et al.
6,002,123 A 12/1999 Suzuki
(Continued)

FOREIGN PATENT DOCUMENTS

JP 63-050868 B2 10/1988
JP 09-065210 A 3/1997
(Continued)

OTHER PUBLICATIONS

US Office Action for U.S. Appl. No. 13/435,368, dated Jun. 12, 2013.
(Continued)

*Primary Examiner* — Pascal M Bui Pho
(74) *Attorney, Agent, or Firm* — Squire Patton Boggs (US) LLP

(57) ABSTRACT

A solid-state image sensing device comprises a unit pixel containing a photoelectric conversion element for detecting a light to generate photoelectrons and at least one electrode for forming an MOS diode structure, a first contact point connected to a first voltage supply for supplying a first voltage to the electrode, a second contact point connected to a second voltage supply for supplying a second voltage higher than the first voltage to the electrode, a first capacitor disposed between the first and second contact points, a change-over switch connected to one of the first and second contact points to selectively switch a voltage applied to the electrode to the first voltage or the second voltage, and pixel drive circuits for driving the change-over switch, thereby alternately applying the first voltage and the second voltage to the electrode to generate, hold, transfer, reset, or discharge the photoelectrons.

6 Claims, 24 Drawing Sheets

(51) Int. Cl.
*H01L 27/148* (2006.01)
*H04N 5/353* (2011.01)
*H04N 5/3745* (2011.01)

(56) References Cited

U.S. PATENT DOCUMENTS

| | | | |
|---|---|---|---|
| 6,433,374 | B1 | 8/2002 | Fukunaga et al. |
| 7,436,496 | B2 | 10/2008 | Kawahito |
| 7,683,954 | B2 * | 3/2010 | Ichikawa et al. ............ 348/308 |
| 7,843,029 | B2 | 11/2010 | Kawahito et al. |
| 7,876,422 | B2 | 1/2011 | Hashimoto et al. |
| 7,888,716 | B2 | 2/2011 | Ichikawa et al. |
| 7,910,964 | B2 | 3/2011 | Kawahito et al. |
| 8,284,282 | B2 | 10/2012 | Oike |
| 8,344,306 | B2 | 1/2013 | Kim |
| 8,710,561 | B2 | 4/2014 | Ichikawa et al. |
| 2007/0158770 | A1 | 7/2007 | Kawahito |
| 2008/0042047 | A1 | 2/2008 | Nam et al. |
| 2008/0111170 | A1 | 5/2008 | Kim et al. |
| 2009/0230437 | A1 | 9/2009 | Kawahito et al. |
| 2009/0251582 | A1 | 10/2009 | Oike |
| 2009/0303362 | A1 | 12/2009 | Ebihara |
| 2010/0231774 | A1 | 9/2010 | Tashiro |
| 2010/0231891 | A1 | 9/2010 | Mase et al. |
| 2011/0019049 | A1 | 1/2011 | Jin et al. |
| 2011/0157354 | A1 | 6/2011 | Kawahito |
| 2012/0119264 | A1 | 5/2012 | Cazaux et al. |
| 2012/0248290 | A1 * | 10/2012 | Kamiyama et al. ........ 250/208.1 |

FOREIGN PATENT DOCUMENTS

| | | |
|---|---|---|
| JP | 10-248035 A | 9/1998 |
| JP | 11-168206 A | 6/1999 |
| JP | 2000-324396 A | 11/2000 |
| JP | 2002-203954 A | 7/2002 |
| JP | 2002-368205 A | 12/2002 |
| JP | 2004-015291 A | 1/2004 |
| JP | 2004-165467 A | 6/2004 |
| JP | 2004-294420 A | 10/2004 |
| JP | 2006-295323 A | 10/2006 |
| JP | 2007-335978 A | 12/2007 |
| JP | 2009-21316 A | 1/2009 |
| JP | 2009-268083 A | 11/2009 |
| JP | 2009-277738 A | 11/2009 |
| JP | 2009-296400 A | 12/2009 |
| JP | 2010-32425 A | 2/2010 |
| JP | 2010-35168 A | 2/2010 |
| JP | 2010-213231 A | 9/2010 |
| JP | 2010-268079 A | 11/2010 |
| WO | WO2007/026777 A1 | 3/2007 |
| WO | 2007/119626 A1 | 10/2007 |
| WO | 2010/130950 A1 | 11/2010 |

OTHER PUBLICATIONS

Japanese Office Action application No. 2011-081325 dated Jul. 8, 2014.
Japanese Office Action application No. 2011-081327 dated Jul. 8, 2014.
Notice of Allowance application No. 13/435,308 dated Mar. 20, 2014.
Japanese Office Action application No. 2011-081328 dated Sep. 2, 2014.
Japanese Office Action application No. 2011-081329 dated Sep. 2, 2014.
Ryohei Miyagawa et al, "Integration-Time Based Computational Image Sensors," ITE Technical Report vol. 19, No. 65, Nov. 1995, pp. 37-41.
Ryohei Miyagawa et al, "CCD-Based Range-Finding Sensor," IEEE Transactions on Electron Devices, vol. 44, No. 10, Oct. 1997, pp. 1648-1652.
Notice of Allowance U.S. Appl. No. 13/435,368 dated Mar. 20, 2014.
US Office Action U.S. Appl. No. 13/435,496 dated Feb. 1, 2013.
Office Action dated Nov. 25, 2014 corresponding to co-pending U.S. Appl. No. 13/435,472, filed Mar. 30, 2012.

* cited by examiner

SOLID-STATE IMAGE SENSING DEVICE WITH A CHANGE-OVER SWITCH

CROSS-REFERENCE TO RELATED APPLICATION

This application is based upon and claims the benefit of priority from Japanese Patent Application No. 2011-081327 filed on Mar. 31, 2011, of which the contents are incorporated herein by reference.

BACKGROUND OF THE INVENTION

1. Field of the Invention

The present invention relates to a solid-state image sensing device with improved pixel drive accuracy.

2. Description of the Related Art

To realize a global electronic shutter function for simultaneously performing light-receiving processes of pixels, a conventional voltage drop problem caused by a peak current has to be solved. When a voltage of a pulse pixel drive signal is applied to a gate to drive the pixel, the peak current is generated. The peak current causes the voltage drop in combination with a wiring resistance or the like. In Japanese Laid-Open Patent Publication No. 2010-268079, the peak current is reduced by delaying a light-receiving timing to prevent the voltage drop. Furthermore, in Japanese Laid-Open Patent Publication No. 2009-296400, a row selection circuit contains a shutter mode response unit for making an impedance value (such as a resistance or reactance value) from a control line to a power source in a global shutter mode larger than that in a rolling shutter mode, so that the peak current in the global shutter mode is reduced by the shutter mode response unit without adversely affecting the rolling shutter mode and a readout process.

SUMMARY OF THE INVENTION

However, in the technologies described in Japanese Laid-Open Patent Publication Nos. 2010-268079 and 2009-296400, the pixel drive signal cannot be sharply raised or dropped though the peak current can be reduced. Therefore, in a high-speed global shutter operation, the pixel drive signal cannot be applied to the pixel as desired, resulting in deteriorated pixel drive accuracy.

Meanwhile, when photoelectrons generated in a photoelectric conversion element are rapidly transferred as in a CCD, it is necessary to supply an electric charge from an external power source to a gate electrode in a pixel at high speed. However, the voltage drop and charging/discharging time are increased due to the electric supply line resistance and parasitic capacitance. Particularly in a case where the process of transferring the generated photoelectrons to an electron hold unit is performed multiple times in one frame in a TOF (time-of-flight) distance sensor, when the gate electrode in the pixel is repeatedly controlled multiple times at an interval of several hundred nanoseconds, the electric charge cannot be supplied from the external power source to the gate electrode at a sufficient speed and the desired voltage cannot be applied disadvantageously.

Accordingly, in view of the above conventional problem, an object of the present invention is to provide a solid-state image sensing device capable of performing the high-speed global shutter operation without the pixel drive accuracy deterioration.

To achieve the above object, according to the present invention, there is provided a solid-state image sensing device comprising a unit pixel containing a photoelectric conversion element for detecting a light to generate photoelectrons and at least one electrode for forming an MOS diode structure, a first contact point connected to a first voltage supply for supplying a first voltage to the electrode, a second contact point connected to a second voltage supply for supplying a second voltage higher than the first voltage to the electrode, a first capacitor disposed between the first contact point and the second contact point, a change-over switch, which is connected to one of the first contact point and the second contact point to selectively switch a voltage applied to the electrode to the first voltage or the second voltage, and pixel drive circuits for driving the change-over switch, thereby alternately applying the first voltage and the second voltage to the electrode to generate, hold, transfer, reset, or discharge the photoelectrons.

The unit pixel may contain a first transfer unit for transferring the photoelectrons generated in the photoelectric conversion element, a photoelectron hold unit located on one side of the photoelectric conversion element with the first transfer unit interposed therebetween for temporarily holding the photoelectrons generated in the photoelectric conversion element, a second transfer unit located on one side of the first transfer unit with the photoelectron hold unit interposed therebetween for transferring the photoelectrons held in the photoelectron hold unit, a floating diffusion layer located on one side of the photoelectron hold unit with the second transfer unit interposed therebetween for converting the transferred photoelectrons to a voltage, a reset transistor for resetting a potential of the floating diffusion layer to a reference potential, and a photoelectron discharger for discharging the photoelectrons generated in the photoelectric conversion element, and at least one of the photoelectric conversion element, the first transfer unit, the photoelectron hold unit, the second transfer unit, the reset transistor, and the photoelectron discharger may have the MOS diode structure.

The solid-state image sensing device may further comprise a pixel array containing a plurality of unit pixels arranged one- or two-dimensionally, and the pixel drive circuits may control the voltage applied to the at least one electrode for forming the MOS diode structure to simultaneously generate, hold, transfer, reset, or discharge the photoelectrons in the unit pixels.

The first capacitor may be located adjacent to an outermost periphery of the pixel array.

Voltages of the first contact point and the second contact point of the first capacitor may be controlled to the first voltage and the second voltage respectively in a blanking period.

The solid-state image sensing device may further comprise a third contact point connected to a third voltage supply (for supplying a third voltage higher than the first voltage and lower than the second voltage to the electrode) and a second capacitor disposed between the first contact point and the third contact point, and the pixel drive circuits may control the change-over switch to apply the third voltage to the electrode in the processes of switching the voltage applied to the electrode from the first voltage to the second voltage and from the second voltage to the first voltage.

Voltages of the first contact point and the second contact point of the first capacitor may be controlled to the first voltage and the second voltage respectively, and voltages of the first contact point and the third contact point of the second capacitor may be controlled to the first voltage and the third voltage respectively, in a blanking period.

A voltage may be applied to an upper side of the electrode, and a lower side of the electrode may be wire-connected to the first contact point inside the solid-state image sensing device and may be further wire-connected to the first voltage supply via a first contact point.

In the present invention, the solid-state image sensing device comprises the unit pixel containing the photoelectric conversion element for detecting the light to generate the photoelectrons and the at least one electrode for forming the MOS diode structure, the first contact point connected to the first voltage supply for supplying the first voltage to the electrode, the second contact point connected to the second voltage supply for supplying the second voltage higher than the first voltage to the electrode, the first capacitor disposed between the first and second contact points, the change-over switch, which is connected to one of the first and second contact points to selectively switch the voltage applied to the electrode to the first or second voltage, and the pixel drive circuits for driving the change-over switch, thereby alternately applying the first and second voltages to the electrode to generate, hold, transfer, reset, or discharge the photoelectrons. Therefore, the first and second voltages of pixel drive signals for driving the unit pixel can be sharply raised and dropped by the first capacitor to improve the pixel drive accuracy. Thus, the global shutter operation can be performed at high speed.

When the solid-state image sensing device further comprises the third contact point connected to the third voltage supply (for supplying the third voltage higher than the first voltage and lower than the second voltage to the electrode) and the second capacitor disposed between the first and third contact points, and the pixel drive circuits control the switch to apply the third voltage to the electrode in the processes of switching the voltage applied to the electrode from the first voltage to the second voltage and from the second voltage to the first voltage, the voltage drop of the second contact point can be reduced in the process of switching the voltage applied to the electrode from the first voltage to the second voltage to further improve the pixel drive accuracy.

When the voltage is applied to the upper side of the electrode, and the lower side is wire-connected to the first contact point inside the solid-state image sensing device and is further wire-connected to the first voltage supply, the resistance and parasitic capacitance of the wiring can be reduced and thus the time constant obtained therefrom can be reduced by minimizing the wiring. Therefore, the electrode can be rapidly charged and discharged, the pixel drive signal for driving the unit pixel can be more sharply raised, and the gate drive signal operation can be performed at high speed, to improve the pixel drive accuracy.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Figure 1:
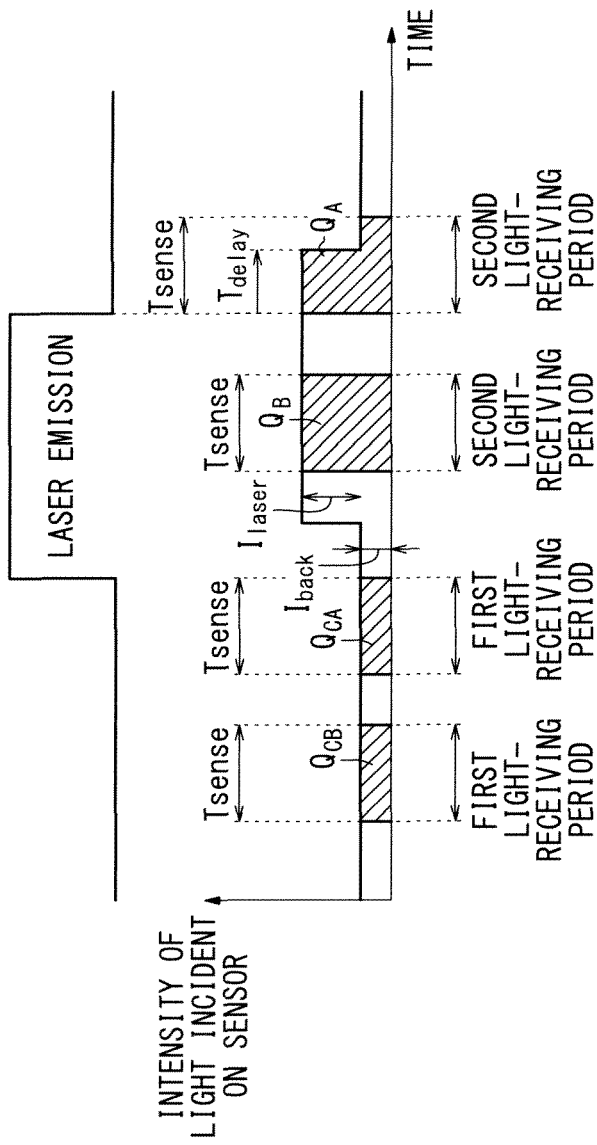
FIG. 1 is a view for illustrating the TOF principle.

A unit pixel and a solid-state image sensing device containing the unit pixel according to a preferred embodiment of the present invention will be described in detail below with reference to the accompanying drawings.

First, an example of the TOF principle will be briefly described with reference to FIG. 1. In first light-receiving periods, an irradiation unit (not shown) does not emit a light such as a laser light to an object, and a light receiving device containing a plurality of unit pixels (not shown) receives only an ambient light for a certain time ($T_{sense}$). In the light receiving device, photoelectrons (negative electric charge) are generated via photoelectric conversion of the incident light in the first light-receiving periods, and then are introduced into a photoelectron hold unit in the unit pixel. This example includes two first light-receiving periods, and the photoelectrons generated by the photoelectric conversion in each first light-receiving period are introduced into the photoelectron hold unit in the unit pixel. $Q_{CB}$ represents the quantity of the light incident on the unit pixel in the former first light-receiving period, and $Q_{CA}$ represents the quantity of the light incident on the unit pixel in the latter first light-receiving period. The term "light-receiving period" means a period in which photoelectrons are generated by an incident light and stored (storage period).

All or part of second light-receiving periods overlap with the period in which the light receiving device is exposed to a reflected light of the light emitted from the irradiation unit. In the light receiving device, photoelectrons are generated via the photoelectric conversion of the incident lights also in the second light-receiving periods, and then are introduced into the photoelectron hold unit in the unit pixel. In this example, in the former second light-receiving period, the irradiation unit constantly emits the light, and the unit pixel constantly receives and converts the ambient light and the reflected light of the light emitted from the irradiation unit for the certain time ($T_{sense}$). In the latter second light-receiving period, the unit pixel receives and converts the lights for the certain time ($T_{sense}$) after the light emission from the irradiation unit is stopped. $Q_B$ represents the quantity of the lights incident on the unit pixel in the former second light-receiving period, and $Q_A$ represents the quantity of the lights incident on the unit pixel in the latter second light-receiving period. $I_{laser}$ represents the intensity of the reflected light of the emitted light, and $I_{back}$ represents the intensity of the ambient light.

Thus, the relations of $Q_A - Q_{CA} \propto I_{laser} \times T_{delay}$ and $Q_B - Q_{CB} \propto I_{laser} \times T_{sense}$ are satisfied, in which $T_{delay}$ represents the time elapsed until the emitted light is reflected by the object and returns.

The above relations can be converted to the expression of $T_{delay} = T_{sense} \times (Q_A - Q_{CA})/(Q_B - Q_{CB})$. Therefore, the distance Z to the object can be obtained using the expression of $Z = c \times T_{delay}/2 = c \times T_{sense} \times (Q_A - Q_{CA})/2(Q_B - Q_{CB})$ in which c represents the light speed.

Figure 2:
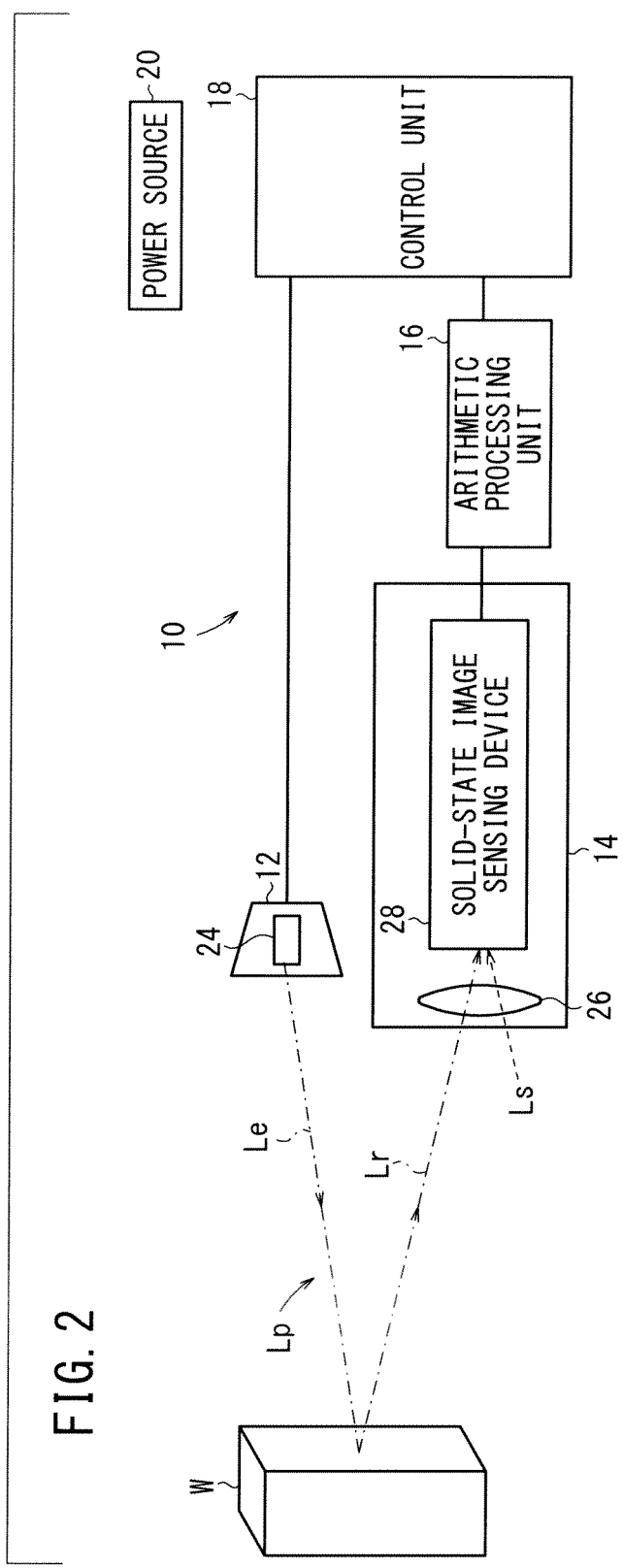
FIG. 2 is a schematic structural view of a distance measuring using a solid-state image sensing device according to an embodiment.

FIG. 2 is a schematic structural view of a distance measuring system 10 using a solid-state image sensing device according to the embodiment. As shown in FIG. 2, the distance measuring system 10 has an irradiation unit 12, an image sensing unit 14, an arithmetic processing unit 16, a control unit 18, and a power source 20.

The power source 20 is for supplying a predetermined power-supply voltage to each portion of the distance measuring system 10. For the sake of brevity, power source lines extending from the power source 20 to the units are omitted in FIG. 2.

The irradiation unit 12 acts to emit a pulsed light Lp to a target object W, and has a light emitter 24 that outputs the pulsed light Lp under control of the control unit 18. In the distance measuring system 10, the light emitter 24 in the irradiation unit 12 may be formed such that semiconductor laser bars having linearly arranged light-emitting spots (emitters) are stacked (connected in series) to perform surface emission.

The light emitter 24 emits an infrared light. For example, the light emitter 24 can emit an infrared light having a wavelength of 870 nanometers (nm) at an output level of 100 watts (W). The light emitter 24 emits the pulsed light Lp with an output time (pulse duration) of 100 nanoseconds.

The light emitter 24 may have a plurality of light-emitting spots arranged in a linear array or a matrix. Another light-emitting device such as a laser diode or a light-emitting diode (LED) may be used as the light emitter 24.

In the distance measuring system 10, the pulsed light Lp emitted from the irradiation unit 12 is reflected by the target object W and then incident on the image sensing unit 14. For illustrative purposes, the pulsed light Lp between the irradiation unit 12 and the target object W is referred to as the emitted light Le, and the pulsed light Lp between the target object W and the image sensing unit 14 is referred to as the reflected light Lr.

The image sensing unit 14 has a lens 26 and a solid-state image sensing device (solid-state image sensing element) 28. The reflected light Lr and the ambient light Ls pass through the lens 26, and are collected and detected in the solid-state image sensing device 28. The solid-state image sensing device 28 is sensitive to the ambient light Ls and the pulsed light Lp emitted from the irradiation unit 12. In the arithmetic processing unit 16, the distance to the target object W is calculated in the manner described for FIG. 1 based on the information on the number of the photoelectrons stored in the solid-state image sensing device 28 in the light-receiving periods.

Figure 3:
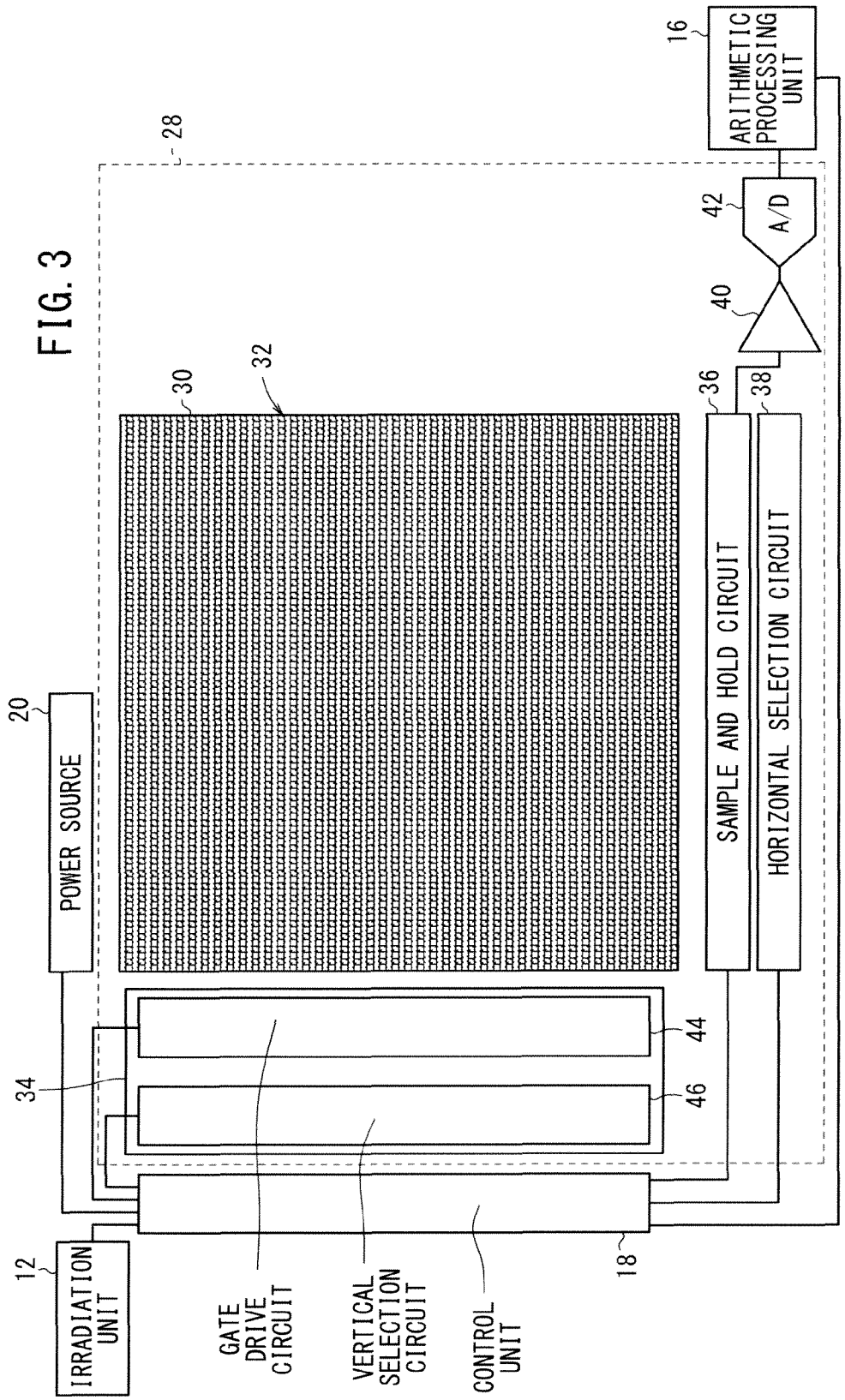
FIG. 3 is a structural view of the solid-state image sensing device.

FIG. 3 is a structural view of the solid-state image sensing device 28. The solid-state image sensing device 28 has a pixel array 32 containing a matrix of unit pixels 30, pixel drive circuit (pixel driver) 34, a sample and hold circuit 36, a horizontal selection circuit 38, an output buffer 40, and an A/D converter 42.

The power source 20 applies a positive power-supply voltage Vdd and a resetting voltage Vref to the pixel array 32. The pixel drive circuit 34 has a gate drive circuit 44 and a vertical selection circuit 46. The gate drive circuit 44 outputs various gate drive signals to generate (store), hold, transfer, and discharge the photoelectrons in each unit pixel 30 in the pixel array 32. The vertical selection circuit 46 has a multiplexer (not shown), selects a row containing a unit pixel 30 to be read, and makes the unit pixel 30 output a voltage signal (pixel signal) corresponding to the held photoelectrons. The horizontal selection circuit 38 has another multiplexer (not shown) and selects a column containing the unit pixel 30 to be read. The read pixel signal is held in the sample and hold circuit 36 and then output through the output buffer 40 and the A/D converter 42 to the arithmetic processing unit 16. The control unit 18 and the arithmetic processing unit 16 may be formed on the solid-state image sensing device 28.

Figure 4:
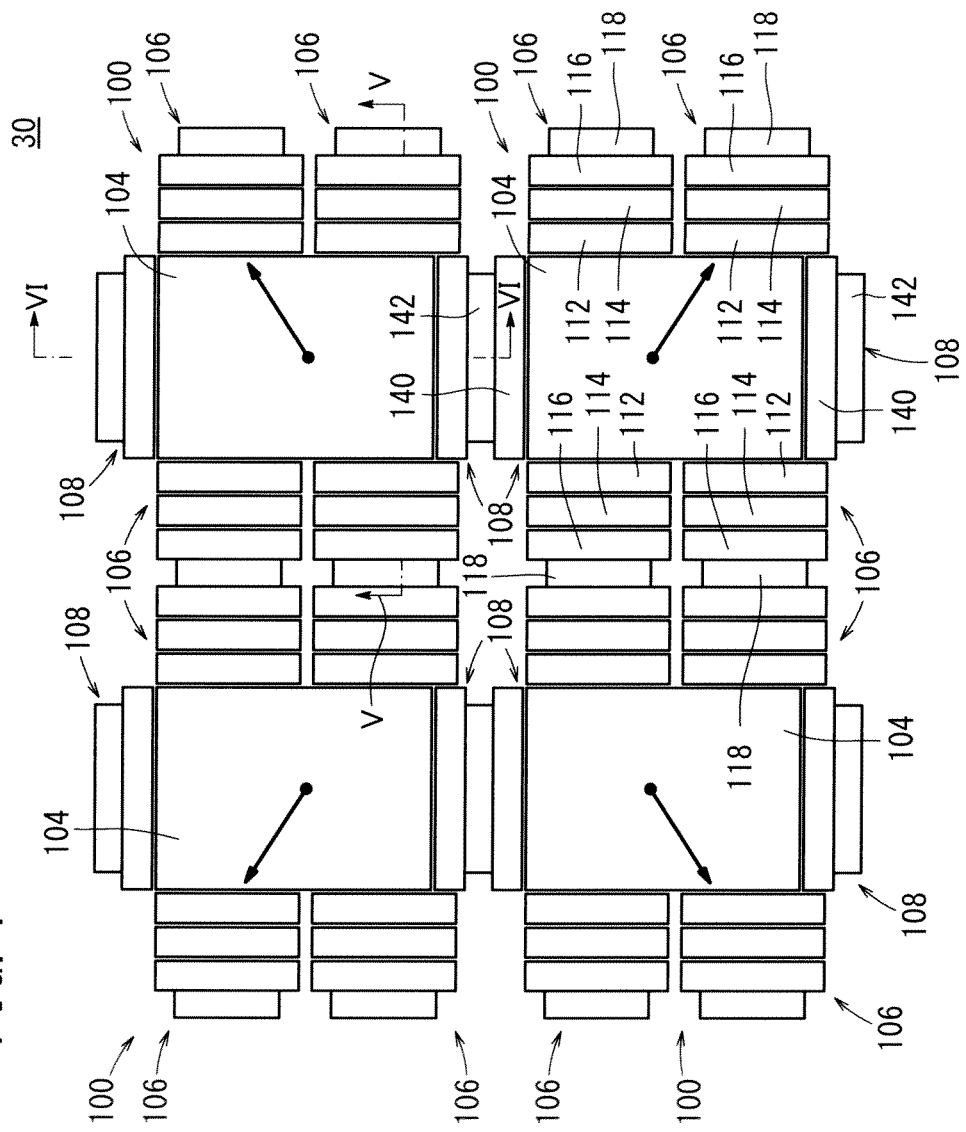
FIG. 4 is a plan view of one unit pixel in the solid-state image sensing device of FIG. 3.
Figure 5:
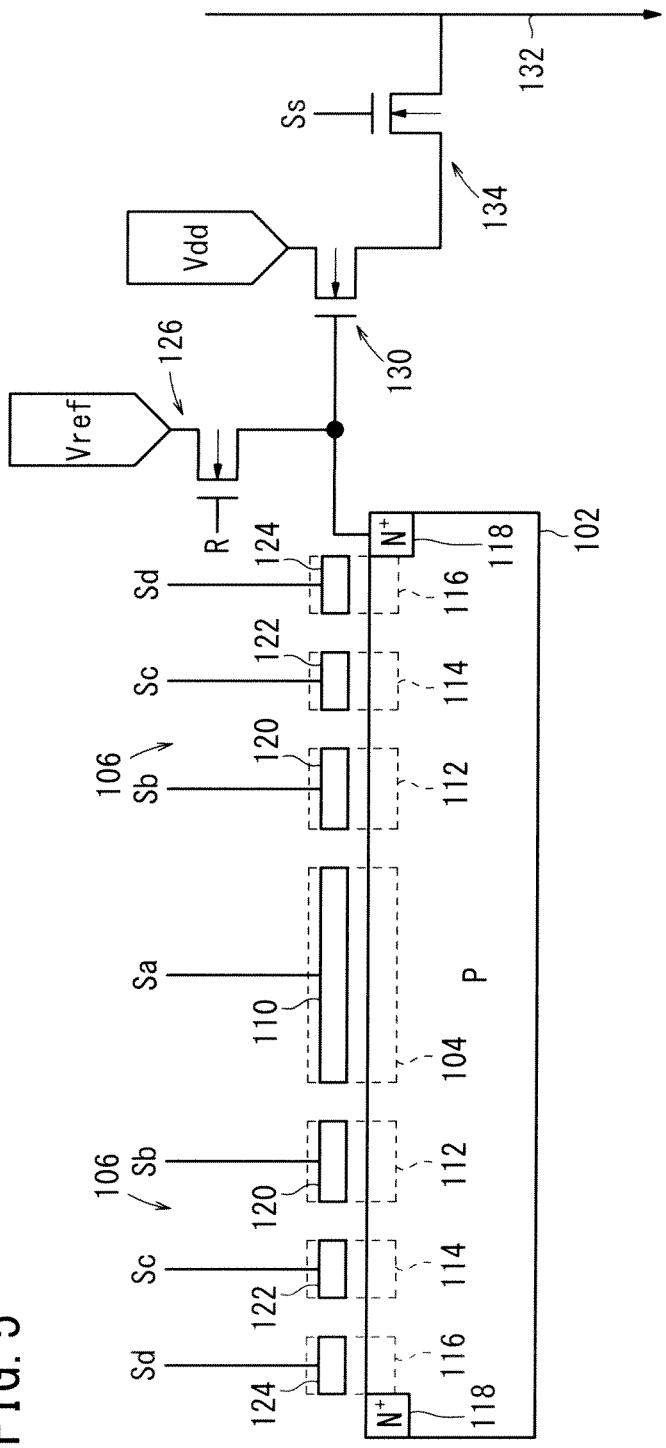
FIG. 5 is a cross-sectional view taken along the line V-V in the direction of the arrows in FIG. 4.
Figure 6:
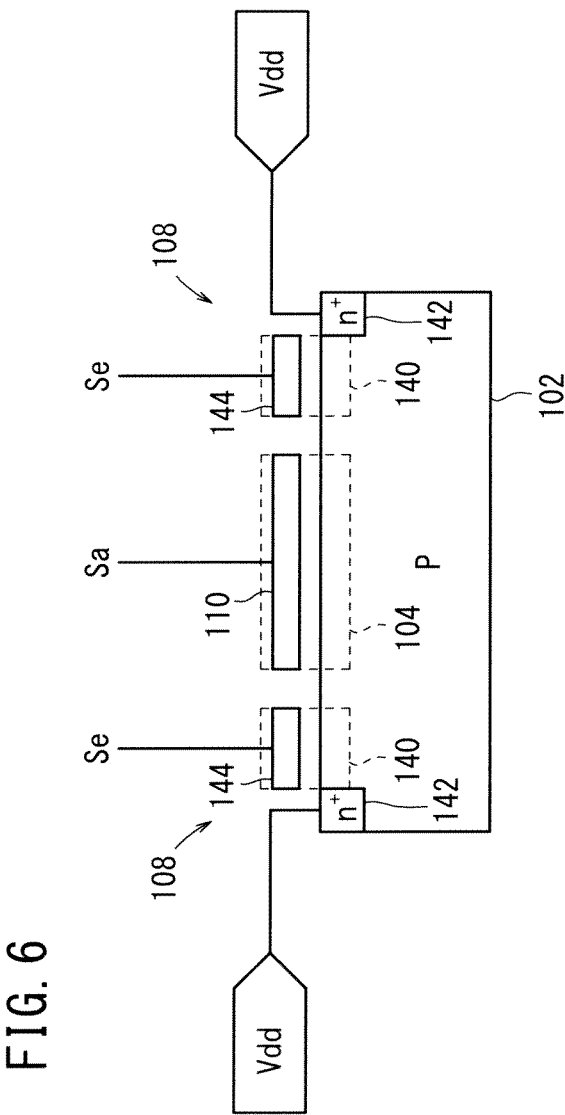
FIG. 6 is a cross-sectional view taken along the line VI-VI in the direction of the arrows in FIG. 4.

FIG. 4 is a plan view of one unit pixel 30 in the solid-state image sensing device 28 of FIG. 3. The unit pixel 30 has a plurality of light receiving devices 100. In this embodiment, the unit pixel 30 has four light receiving devices 100 arranged in a matrix. FIGS. 5 and 6 are cross-sectional views of the light receiving device 100 of FIG. 4. More specifically, FIG. 5 is a cross-sectional view taken along the line V-V in the direction of the arrows in FIG. 4, and FIG. 6 is a cross-sectional view taken along the line VI-VI in the direction of the arrows in FIG. 4.

The unit pixel 30 has the four light receiving devices 100 arranged in a matrix. The light receiving device 100 has a p-type (first-conductivity-type) semiconductor substrate 102, and thereon a photoelectric conversion element 104, four photoelectron distributors 106, and two photoelectron dischargers 108. The photoelectric conversion element 104 has an electrode (hereinafter referred to as photogate) 110, which is formed on the p-type semiconductor substrate 102 with an insulator (not shown) interposed therebetween. The photoelectric conversion element 104 is a photodiode capable of detecting a light and generating photoelectrons or negative electric charge (converting the detected light to the photoelectrons). A gate drive signal Sa for driving the photoelectric conversion element 104 is applied to the photogate 110 by the gate drive circuit 44.

The photoelectron distributor 106 has a first transfer unit 112, a photoelectron hold unit 114, a second transfer unit 116, and a floating diffusion layer 118. The first transfer unit 112 has an MOS diode structure containing an electrode (first transfer gate) 120, which is formed on the p-type semiconductor substrate 102 with the insulator interposed therebetween, for transferring the photoelectrons generated in the photoelectric conversion element 104 to the photoelectron hold unit 114 (see FIG. 5). A gate drive signal Sb for driving the first transfer unit 112 is input from the gate drive circuit 44 to the first transfer gate 120. The photoelectron hold unit 114 is located on one side of the photoelectric conversion element 104 with the first transfer unit 112 interposed therebetween and has an MOS diode structure containing an electrode (hold gate) 122, which is formed on the p-type semiconductor substrate 102 with the insulator interposed therebetween, for temporarily collecting and holding the photoelectrons generated in the photoelectric conversion element 104 (see FIG. 5). A gate drive signal Sc for driving the photoelectron hold unit 114 is applied from the gate drive circuit 44 to the hold gate 122.

The second transfer unit 116 is located on one side of the first transfer unit 112 with the photoelectron hold unit 114 interposed therebetween and has an MOS diode structure containing an electrode (second transfer gate) 124, which is formed on the p-type semiconductor substrate 102 with the insulator interposed therebetween, for transferring the photoelectrons stored in the photoelectron hold unit 114 (see FIG. 5). A gate drive signal Sd for driving the second transfer unit 116 is applied from the gate drive circuit 44 to the second transfer gate 124. The floating diffusion (FD) layer 118 is located on one side of the photoelectron hold unit 114 with the second transfer unit 116 interposed therebetween for taking in the photoelectrons transferred from the photoelectron hold unit 114 and converting the photoelectrons to a voltage. The floating diffusion layer 118 is formed such that an n-type (second-conductivity-type) impurity is disposed on the p-type semiconductor substrate 102.

As shown in FIG. 4, in one light receiving device 100, each two of the four photoelectron distributors 106 are arranged in the horizontal direction (the right-left direction) symmetrically with respect to the photoelectric conversion element 104. Thus, two of the four photoelectron distributors 106 are arranged vertically on each of the right and left sides of the photoelectric conversion element 104. In one unit pixel 30, the light receiving devices 100 adjacent to each other in the horizontal direction share two floating diffusion layers 118 formed therebetween. Thus, some of the floating diffusion layers 118 are shared by a plurality of light receiving devices 100.

As shown in FIG. 5, the floating diffusion layer 118 is connected to a reset transistor 126 for resetting the potential of the floating diffusion layer 118 to a reference potential. The floating diffusion layer 118 is connected to the source of the reset transistor 126, the resetting voltage Vref is applied from the power source 20 to the drain, and a resetting signal R is supplied from the gate drive circuit 44 to the gate. When a high resetting signal R is supplied to the gate of the reset transistor 126, the reset transistor 126 is turned on to reset the potential of the floating diffusion layer 118 to the reference potential.

Further, the floating diffusion layer 118 is connected to a signal read transistor 130 for reading a voltage signal corresponding to the photoelectrons stored in the floating diffusion layer 118. The signal read transistor 130 is connected to a selection transistor 134 for selecting whether the voltage signal read by the signal read transistor 130 is output or not to a signal read line 132. The power-supply voltage Vdd is applied from the power source 20 to the drain of the signal read transistor 130, the gate is connected to the floating diffusion layer 118, and the source is connected to the drain of the selection transistor 134. When a high selection signal Ss is supplied from the vertical selection circuit 46 to the selection transistor 134, the selection transistor 134 is turned on to read from the signal read line 132 a voltage corresponding to the photoelectrons stored in the floating diffusion layer 118. The source of the selection transistor 134 is connected to the signal read line 132.

The photoelectron discharger 108 has a third transfer unit 140 and a diffusion layer 142. The third transfer unit 140 has an MOS diode structure containing an electrode (third transfer gate) 144, which is formed on the p-type semiconductor substrate 102 with the insulator interposed therebetween, for transferring the photoelectrons generated in the photoelectric conversion element 104 to the diffusion layer 142 (see FIG. 6).

The diffusion layer 142 is located on one side of the photoelectric conversion element 104 with the third transfer unit 140 interposed therebetween. The power-supply voltage Vdd is applied from the power source 20 to the diffusion layer 142. When a discharge signal Se is input from the gate drive circuit 44 to the third transfer gate 144, the photoelectrons generated in the photoelectric conversion element 104 are discharged from the diffusion layer 142 through the third transfer unit 140.

As shown in FIG. 4, in one light receiving device 100, the two photoelectron dischargers 108 are arranged in the vertical direction (the up-down direction) symmetrically with respect to the photoelectric conversion element 104. In one unit pixel 30, the light receiving devices 100 adjacent to each other in the vertical direction share the diffusion layer 142 formed therebetween. Thus, some of the diffusion layers 142 are shared by the light receiving devices 100.

Figure 7A:
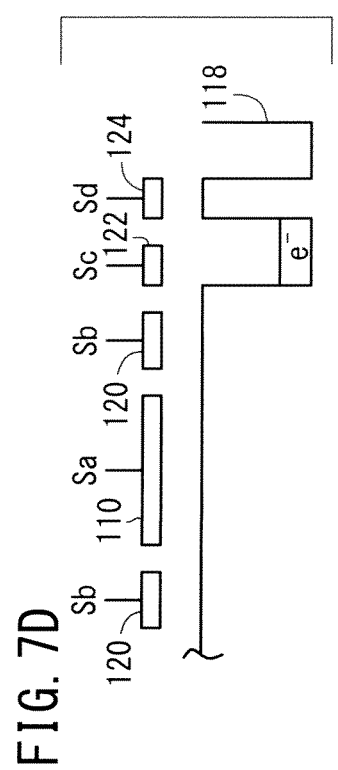
FIG. 7A is a potential diagram in the process of generating photoelectrons in a photoelectric conversion element.
Figure 7B:
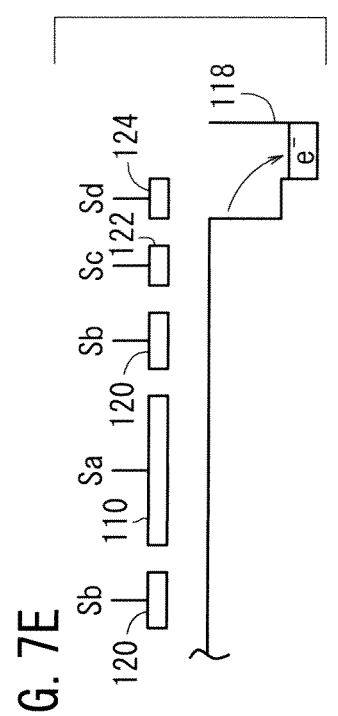
FIGS. 7B and 7C are potential diagrams in the process of transferring the photoelectrons generated in the photoelectric conversion element to a photoelectron hold unit.
Figure 7C:
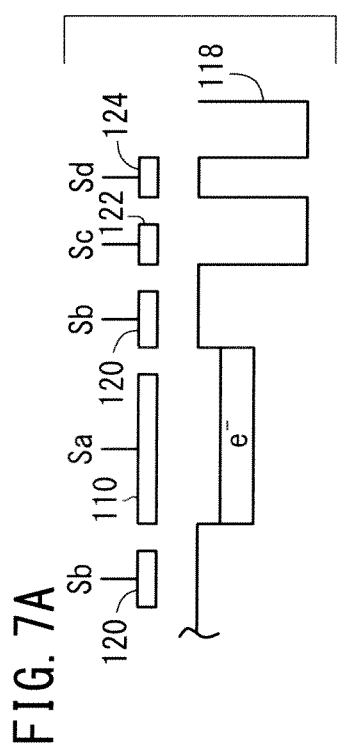
Figure 7D:
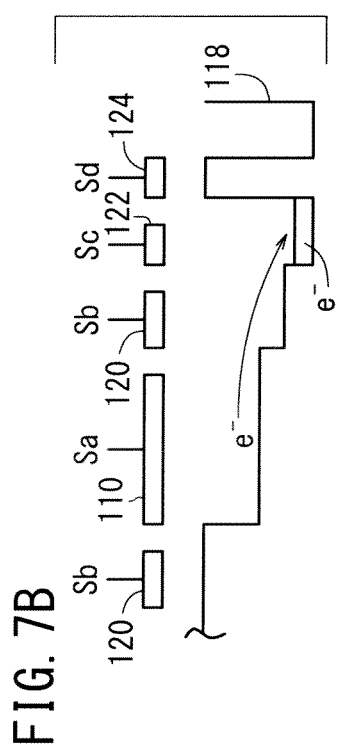
FIG. 7D is a potential diagram in the process of holding the photoelectrons in the photoelectron hold unit.
Figure 7E:
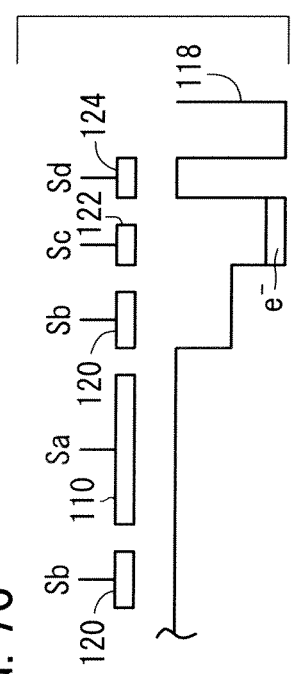
FIG. 7E is a potential diagram in the process of transferring the photoelectrons held in the photoelectron hold unit to a floating diffusion layer.

FIG. 7A is a potential diagram of the photoelectric conversion element 104, the first transfer unit 112, the photoelectron hold unit 114, and the second transfer unit 116 in the process of generating the photoelectrons in the photoelectric conversion element 104, FIGS. 7B and 7C are potential diagrams thereof in the process of transferring the photoelectrons generated in the photoelectric conversion element 104 to the photoelectron hold unit 114, FIG. 7D is a potential diagram thereof in the process of holding the photoelectrons in the photoelectron hold unit 114, and FIG. 7E is a potential diagram thereof in the process of transferring the photoelectrons held in the photoelectron hold unit 114 to the floating diffusion layer 118.

As shown in FIG. 7A, a high gate drive signal Sa is input to the photogate 110 to lower the potential level of the photoelectric conversion element 104, whereby the generated photoelectrons $e^-$ are stored in the photoelectric conversion element 104. Next, as shown in FIG. 7B, a high gate drive signal Sb is input to the first transfer gate 120, whereby the photoelectrons e⁻ generated in the photoelectric conversion element 104 are transferred to the photoelectron hold unit 114. In this process, a high gate drive signal Sc is input to the hold gate 122. Furthermore, as shown in FIG. 7C, a low gate drive signal Sa is input to the photogate 110 to increase the potential level of the photoelectric conversion element 104, whereby all photoelectrons e⁻ generated in the photoelectric conversion element 104 are transferred to the photoelectron hold unit 114. Then, as shown in FIG. 7D, a low gate drive signal Sb is input to the first transfer gate 120, whereby the photoelectrons generated in the photoelectric conversion element 104 are held in the photoelectron hold unit 114. The processes shown in FIGS. 7A to 7C are repeated, so that the photoelectrons generated in the photoelectric conversion element 104 in the multiple light-receiving periods can be held in the photoelectron hold unit 114.

Then, as shown in FIG. 7E, a high gate drive signal Sd is input to the second transfer gate 124 to lower the potential level of the second transfer unit 116, and a low gate drive signal Sc is input to the hold gate 122 to increase the potential level of the photoelectron hold unit 114, whereby the photoelectrons e⁻ held in the photoelectron hold unit 114 are transferred to the floating diffusion layer 118.

Figure 8:
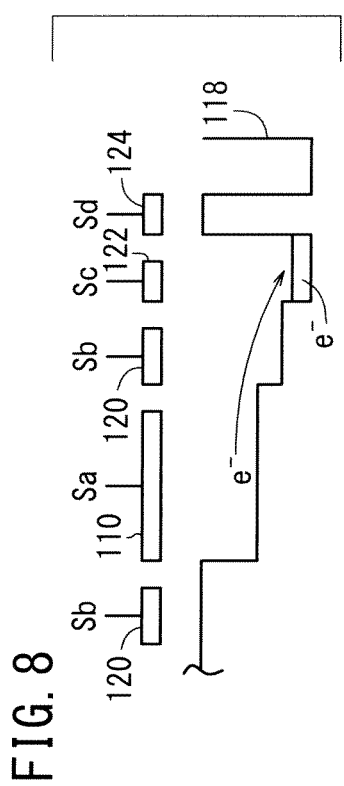
FIG. 8 is a potential diagram of the photoelectric conversion element, the first transfer unit, the photoelectron hold unit, and the second transfer unit showing a photoelectron transfer state according to another example.

As shown in FIG. 8, the high gate drive signal Sb may be input to the first transfer gate 120 also in the light-receiving process. In this case, the light-receiving process and the photoelectron transfer process of the photoelectrons generated in the photoelectric conversion element 104 can be carried out at the same time.

Figure 9:
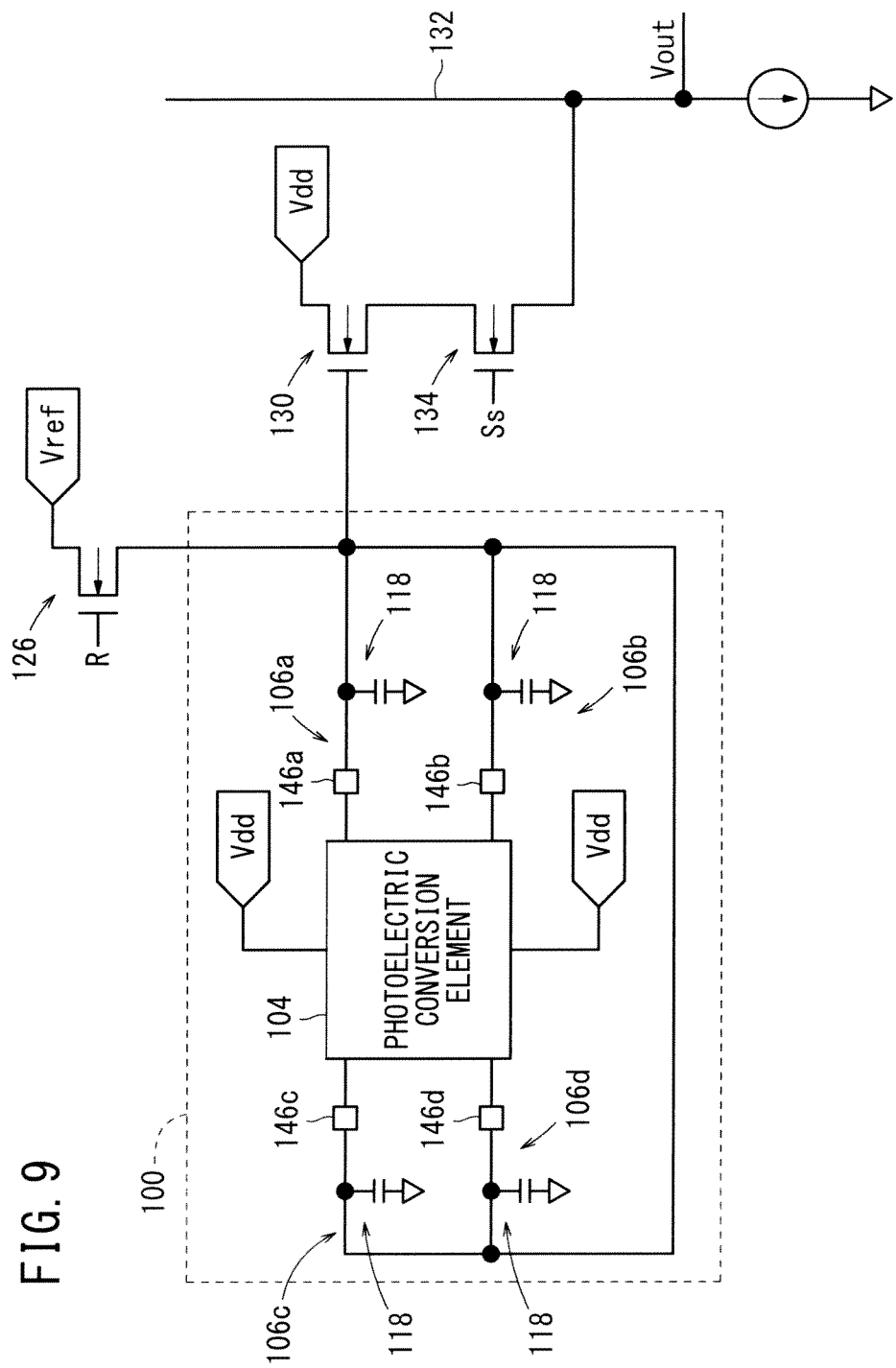
FIG. 9 is a view of a circuit structure of a light receiving device shown in FIG. 4.

FIG. 9 is a view of an example of the circuit structure of the light receiving device 100. The photoelectrons stored in the photoelectric conversion element 104 in the light receiving device 100 are transferred through transfer pathways 170a, 170b, 170c, and 170d to the floating diffusion layers 118 in the photoelectron distributors 106 (herein referred to as the photoelectron distributors 106a, 106b, 106c, and 106d for illustrative purposes). Each of the transfer pathways 146a, 146b, 146c, and 146d contains the first transfer unit 112, the photoelectron hold unit 114, and the second transfer unit 116 in each of the photoelectron distributors 106a, 106b, 106c, and 106d. The floating diffusion layers 118 in the photoelectron distributors 106a, 106b, 106c, and 106d are connected to the source of one reset transistor 126 and to the gate of the one signal read transistor 130.

Before the photoelectrons held in the photoelectron hold unit 114 are transferred to the floating diffusion layer 118 in each of the photoelectron distributors 106a, 106b, 106c, and 106d, the reset transistor 126 is turned on to reset the floating diffusion layer 118 at the reference potential, and the voltage of the floating diffusion layer 118 at the time (hereinafter referred to as the black level) is read from the signal read line 132. Then, the photoelectrons held in the photoelectron hold unit 114 are sequentially transferred to the floating diffusion layer 118. The photoelectrons transferred to the floating diffusion layer 118 are sequentially converted to a voltage signal (signal level) by the signal read transistor 130, and the voltage signal is read from the signal read line 132 through the selection transistor 134.

Specifically, the reset transistor 126 is turned on, whereby the potential of each floating diffusion layer 118 is reset to read the black level, then the photoelectrons held in the photoelectron hold unit 114 are transferred to the floating diffusion layer 118 in the photoelectron distributor 106a, and the voltage signal (signal level) corresponding to the transferred photoelectrons is read from the signal read line 132. Next, the reset transistor 126 is turned on, whereby the potential of each floating diffusion layer 118 is reset to read the black level, then the photoelectrons held in the photoelectron hold unit 114 are transferred to the floating diffusion layer 118 in the photoelectron distributor 106b, and the voltage signal (signal level) corresponding to the transferred photoelectrons is read from the signal read line 132. Furthermore, the reset transistor 126 is turned on, whereby the potential of each floating diffusion layer 118 is reset to read the black level, then the photoelectrons held in the photoelectron hold unit 114 are transferred to the floating diffusion layer 118 in the photoelectron distributor 106c, and the voltage signal (signal level) corresponding to the transferred photoelectrons is read from the signal read line 132. Finally, the reset transistor 126 is turned on, whereby the potential of each floating diffusion layer 118 is reset to read the black level, then the photoelectrons held in the photoelectron hold unit 114 are transferred to the floating diffusion layer 118 in the photoelectron distributor 106d, and the voltage signal (signal level) corresponding to the transferred photoelectrons is read from the signal read line 132.

All the voltage signals corresponding to the photoelectrons held in the photoelectron hold units 114 of the photoelectron distributors 106a, 106b, 106c, and 106d in the light receiving device 100 are read from the same signal read line 132 in this manner. It should be noted that the photoelectron dischargers 108 are omitted from FIG. 9.

Figure 10:
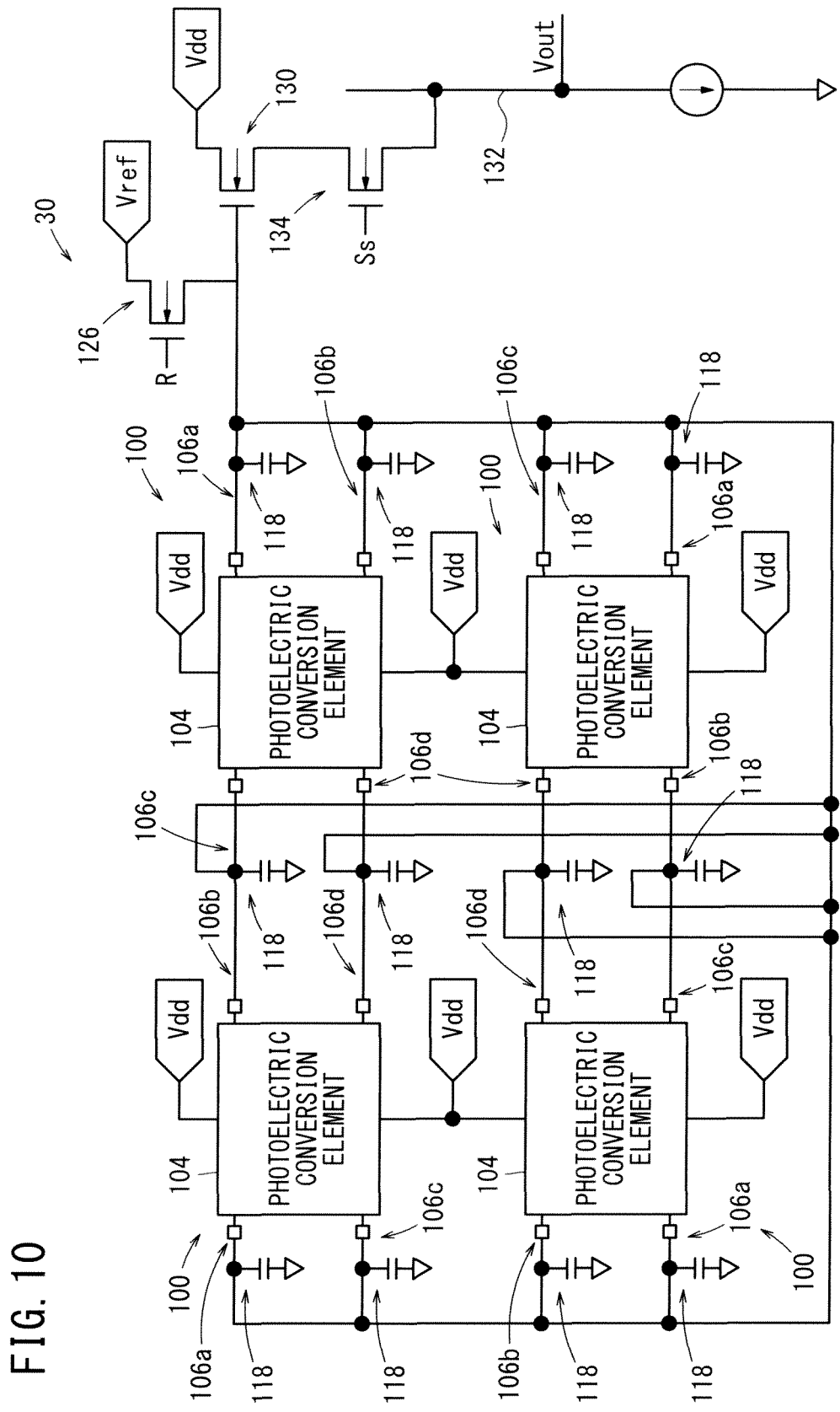
FIG. 10 is a circuit diagram of the unit pixel of FIG. 4 using the light receiving device of FIG. 9.

FIG. 10 is a circuit diagram of the unit pixel 30 of FIG. 4 using the light receiving device 100 of FIG. 9. The unit pixel 30 has the four light receiving devices 100, each of which has the one photoelectric conversion element 104, four photoelectron distributors 106a, 106b, 106c, and 106d, and two photoelectron dischargers 108, as shown in FIG. 9. The photoelectron dischargers 108 are omitted also in FIG. 10. In all the light receiving devices 100, the floating diffusion layers 118 of the photoelectron distributors 106a, 106b, 106c, and 106d are each connected to the source of the reset transistor 126 and the gate of the signal read transistor 130.

The reset transistor 126 is turned on, whereby the potential of each floating diffusion layer 118 in the photoelectron distributors 106a, 106b, 106c, and 106d is reset to read the black level, then the photoelectrons held in the photoelectron hold unit 114 are transferred to the floating diffusion layer 118 in each photoelectron distributor 106a, and the voltage signal (signal level) corresponding to the transferred photoelectrons is read from the signal read line 132. Thus, a voltage signal corresponding to the total number of the photoelectrons, transferred to the floating diffusion layers 118 of the photoelectron distributors 106a in the light receiving devices 100 of the unit pixel 30, is read from the signal read line 132.

Next, the reset transistor 126 is turned on, whereby the potential of each floating diffusion layer 118 in the photoelectron distributors 106a, 106b, 106c, and 106d is reset to read the black level, then the photoelectrons held in the photoelectron hold unit 114 are transferred to the floating diffusion layer 118 in each photoelectron distributor 106b, and the voltage signal (signal level) corresponding to the transferred photoelectrons is read from the signal read line 132. Thus, a voltage signal corresponding to the total number of the photoelectrons, transferred to the floating diffusion layers 118 of the photoelectron distributors 106b in the light receiving devices 100 of the unit pixel 30, is read from the signal read line 132.

Furthermore, the reset transistor 126 is turned on, whereby the potential of each floating diffusion layer 118 in the photoelectron distributors 106a, 106b, 106c, and 106d is reset to read the black level, then the photoelectrons held in the photoelectron hold unit 114 are transferred to the floating diffusion layer 118 in each photoelectron distributor 106c, and the voltage signal (signal level) corresponding to the transferred photoelectrons is read from the signal read line 132. Thus, a voltage signal corresponding to the total number of the photoelectrons, transferred to the floating diffusion layers 118 of the photoelectron distributors 106c in the light receiving devices 100 of the unit pixel 30, is read from the signal read line 132.

Finally, the reset transistor 126 is turned on, whereby the potential of each floating diffusion layer 118 in the photoelectron distributors 106a, 106b, 106c, and 106d is reset to read the black level, then the photoelectrons held in the photoelectron hold unit 114 are transferred to the floating diffusion layer 118 in each photoelectron distributor 106d, and the voltage signal (signal level) corresponding to the transferred photoelectrons is read from the signal read line 132. Thus, a voltage signal corresponding to the total number of the photoelectrons, transferred to the floating diffusion layers 118 of the photoelectron distributors 106d in the light receiving devices 100 of the unit pixel 30, is read from the signal read line 132. All the voltage signals corresponding to the photoelectrons held in the photoelectron hold units 114 of the light receiving devices 100 in the unit pixel 30 are read from the same signal read line 132 in this manner.

As shown in FIG. 10, in the unit pixel 30, the photoelectron distributors 106a, 106b, 106c, and 106d in each light receiving device 100 have different transfer directions. For example, the photoelectron distributor 106a in the upper-right light receiving device 100 has an upper-right transfer direction, the photoelectron distributor 106a in the lower-right light receiving device 100 has a lower-right transfer direction, the photoelectron distributor 106a in the upper-left light receiving device 100 has an upper-left transfer direction, and the photoelectron distributor 106a in the lower-left light receiving device 100 has a lower-left transfer direction.

As shown in FIG. 10, the photoelectron distributors 106c and 106d in the upper-right light receiving device 100 and the photoelectron distributors 106b and 106d in the upper-left light receiving device 100 share the floating diffusion layers 118, and the photoelectron distributors 106d and 106b in the lower-right light receiving device 100 and the photoelectron distributors 106d and 106c in the lower-left light receiving device 100 share the floating diffusion layers 118.

Figure 11:
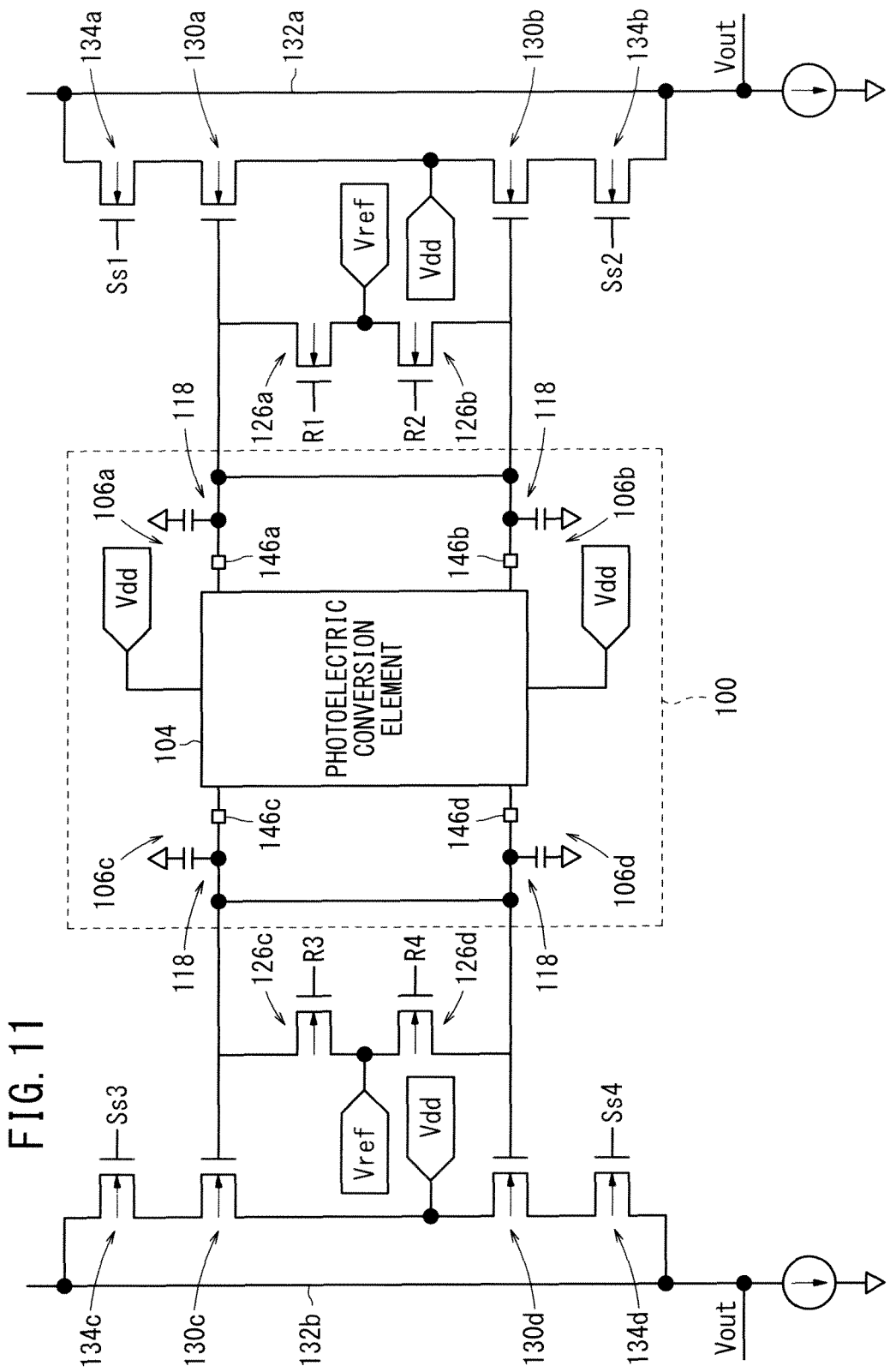
FIG. 11 is a view of another circuit structure of the unit pixel different from that of FIG. 9.

As shown in FIG. 11, the light receiving device 100 may have two signal read lines 132a and 132b. In this case, for example, the voltage signals corresponding to the photoelectrons transferred to the floating diffusion layers 118 in the photoelectron distributors 106a and 106b are read from the signal read line 132a, and the voltage signals corresponding to the photoelectrons transferred to the floating diffusion layers 118 in the photoelectron distributors 106c and 106d are read from the signal read line 132b. In the light receiving device 100 shown in FIG. 10, the sources of reset transistors 126a, 126b, 126c, and 126d are connected to the floating diffusion layers 118 of the photoelectron distributors 106a, 106b, 106c, and 106d, and the resetting voltage Vref is applied from the power source 20 to the drains. Furthermore, resetting signals R1, R2, R3, and R4 are supplied to the gates of the reset transistors 126a, 126b, 126c, and 126d. In addition, the gates of signal read transistors 130a, 130b, 130c, and 130d are connected to the floating diffusion layers 118 in the photoelectron distributors 106a, 106b, 106c, and 106d, and selection signals Ss1, Ss2, Ss3, and Ss4 are supplied to the gates of selection transistors 134a, 134b, 134c, and 134d. Thus, it is only necessary to connect the signal read line 132 with the floating diffusion layers 118 in the light receiving device 100.

The photoelectrons held in each photoelectron hold unit 114 in the light receiving device 100 shown in FIG. 11 may be read by using a separate signal read transistor 130 in this manner.

The light receiving device 100 has the four photoelectron distributors 106a, 106b, 106c, and 106d containing the photoelectron hold units 114 in this manner, so that the distance to the target object W can be obtained by the distance measuring system 10. Specifically, the photoelectrons generated in the photoelectric conversion element 104 in the former first light-receiving period are transferred to the photoelectron hold unit 114 in the photoelectron distributor 106a, the photoelectrons generated in the photoelectric conversion element 104 in the latter first light-receiving period are transferred to the photoelectron hold unit 114 in the photoelectron distributor 106b, the photoelectrons generated in the photoelectric conversion element 104 in the former second light-receiving period are transferred to the photoelectron hold unit 114 in the photoelectron distributor 106c, and the photoelectrons generated in the photoelectric conversion element 104 in the latter second light-receiving period are transferred to the photoelectron hold unit 114 in the photoelectron distributor 106d. As a result, the photoelectrons corresponding to $Q_{CB}$, $Q_{CA}$, $Q_B$, and $Q_A$ can be obtained. The distance to the target object W can be obtained by reading out the voltage signals corresponding to the photoelectrons from the floating diffusion layers 118 in the photoelectron distributors 106a, 106b, 106c, and 106d. The light-receiving process shown in FIG. 1 may be carried out multiple times (e.g. 100 times). At the end of each of the light-receiving periods (the former first light-receiving period, the latter first light-receiving period, the former second light-receiving period, and the latter second light-receiving period), the photoelectrons generated in the photoelectric conversion element 104 are allocated by the photoelectron distributors 106a, 106b, 106c, and 106d and sequentially held in the photoelectron hold units 114. After a plurality of the light-receiving periods expire, the photoelectrons held in the photoelectron hold units 114 in the photoelectron distributors 106a, 106b, 106c, and 106d are read out.

In FIG. 4, the arrows shown in the photoelectric conversion elements 104 in the light receiving devices 100 each represent a photoelectron transfer direction in one of the four light-receiving periods shown in FIG. 1. Specifically, the photoelectrons generated in the upper-left photoelectric conversion element 104 are transferred to the upper-left photoelectron distributor 106, the photoelectrons generated in the lower-left photoelectric conversion element 104 are transferred to the lower-left photoelectron distributor 106, the photoelectrons generated in the upper-right photoelectric conversion element 104 are transferred to the upper-right photoelectron distributor 106, and the photoelectrons generated in the lower-right photoelectric conversion element 104 are transferred to the lower-right photoelectron distributor 106.

In this embodiment, the unit pixel 30 contains a plurality of the light receiving devices 100. The photoelectrons, which are allocated by the photoelectron distributors 106 in the different transfer directions in the light receiving devices 100 of the unit pixel 30, are summed up and output. Therefore, the variation in the number of the photoelectrons transferred in each allocation direction can be reduced without depending on the allocation directions.

Specifically, after the light-receiving and transfer processes are repeated multiple times, the photoelectrons in the photoelectron distributors 106 are transferred to the floating diffusion layers 118. Since the photoelectrons are vertically and horizontally transferred, once stored, and then transferred to the floating diffusion layers 118, the photoelectron transfer speeds between the photoelectric conversion elements 104 and the first transfer units 112 can be averaged in the vertical and horizontal directions. Thus, when the four photoelectric conversion elements 104 have the different vertical and horizontal transfer directions in each of the four light-receiving periods shown in FIG. 1, the photoelectron transfer speeds do not depends on the allocation directions in the unit pixel 30, and calculation processes can be accurately carried out in a latter signal processing.

In a case where the unit pixel 30 has only one light receiving device 100, the transfer speed may be lowered in one direction due to the production or crystal orientation of the light receiving device 100, and the photoelectron information (the voltage signal corresponding to the photoelectrons) cannot be accurately obtained in an allocation direction. The time for allocating the photoelectrons generated in the photoelectric conversion element 104 (the timings at which the gate drive signals Sb, Sc, and Sd are supplied to the first transfer unit 112, the photoelectron hold unit 114, and the second transfer unit 116) is predetermined. Thus, when the photoelectrons are transferred in the allocation direction at the lowered transfer speed, it is impossible to transfer all the photoelectrons generated in the photoelectric conversion element 104.

In this embodiment, the light receiving device 100 in the unit pixel 30 has the photoelectron distributors 106 each containing the first transfer unit 112 for transferring the photoelectrons generated in the photoelectric conversion element 104, the photoelectron hold unit 114 for temporarily storing the photoelectrons, the second transfer unit 116 for transferring the photoelectrons stored in the photoelectron hold unit 114, and the floating diffusion layer 118 for storing the transferred photoelectrons and converting them to the voltage. Therefore, the photoelectrons generated in the photoelectric conversion element can be distributed in a plurality of directions and then read out, and the reset noise can be accurately removed.

The photoelectrons, which are generated in the photoelectric conversion element 104 and allocated by the photoelectron distributor 106, are held in the photoelectron hold unit 114. In the process of reading the photoelectrons held in the photoelectron hold unit 114, first the potential of the floating diffusion layer 118 in the photoelectron distributor 106 is reset to read the black level, then the photoelectrons held in the photoelectron hold unit 114 are transferred to the floating diffusion layer 118, and the voltage signal corresponding to the photoelectrons is read out. Therefore, the gap between the reset timing and the read timing for the potential of the floating diffusion layer 118 can be minimized. Thus, the black level can be accurately obtained, and the reset noise can be accurately removed.

The unit pixel 30 contains a plurality of the light receiving devices 100. Therefore, the variation in the number of the photoelectrons transferred in each allocation direction, which depends on the variation in the transfer speed due to the production or crystal orientation of the light receiving device 100, can be reduced to improve the receiving accuracy. Furthermore, since the light receiving devices 100 in the unit pixel 30 share at least part of the floating diffusion layers 118, the unit pixel can be miniaturized and the chip area can be reduced, whereby the costs for the unit pixel 30 can be reduced and the resolution of the unit pixels 30 can be increased.

The unit pixel 30 has the four light receiving devices 100 arranged in a matrix, each light receiving device 100 has the four photoelectron distributors 106, each two of the four photoelectron distributors 106 are arranged in the horizontal direction symmetrically with respect to the photoelectric conversion element 104, and the light receiving devices 100 adjacent to each other in the horizontal direction share the floating diffusion layers 118 formed therebetween. As a result, the unit pixel 30 can be miniaturized and the chip area can be reduced, whereby the costs for the unit pixel 30 can be reduced and the resolution of the unit pixels 30 can be increased.

The solid-state image sensing device 28, which contains the pixel array 32 containing the unit pixels 30 arranged one- or two-dimensionally, has the signal read transistor 130 for reading the potentials of the floating diffusion layers 118 and the signal read line 132 for reading the signals from the signal read transistor 130. The potentials of the floating diffusion layers 118 in the unit pixel 30 are read from the one signal read transistor 130. Therefore, a signal read circuit can be shared, the output variation due to the production of circuits can be reduced, and the solid-state image sensing device 28 can be miniaturized to increase the resolution.

When the former and latter first light-receiving periods (in which only the ambient light Ls is received) and the former and latter second light-receiving periods (in which the ambient light Ls and the reflected light Lr are received) have the same light-receiving time length to obtain the distance to the target object W, the received light amount in the former first light-receiving period is equal to that in the latter first light-receiving period. Therefore, the light-receiving process may include only one of the first light-receiving periods in which only the ambient light Ls is received. In this case, $Q_{CA}$ may be considered to be equal to $Q_{CB}$ to obtain the distance to the object. Thus, the unit pixel 30 may have a structure shown in FIG. 12.

Figure 12:
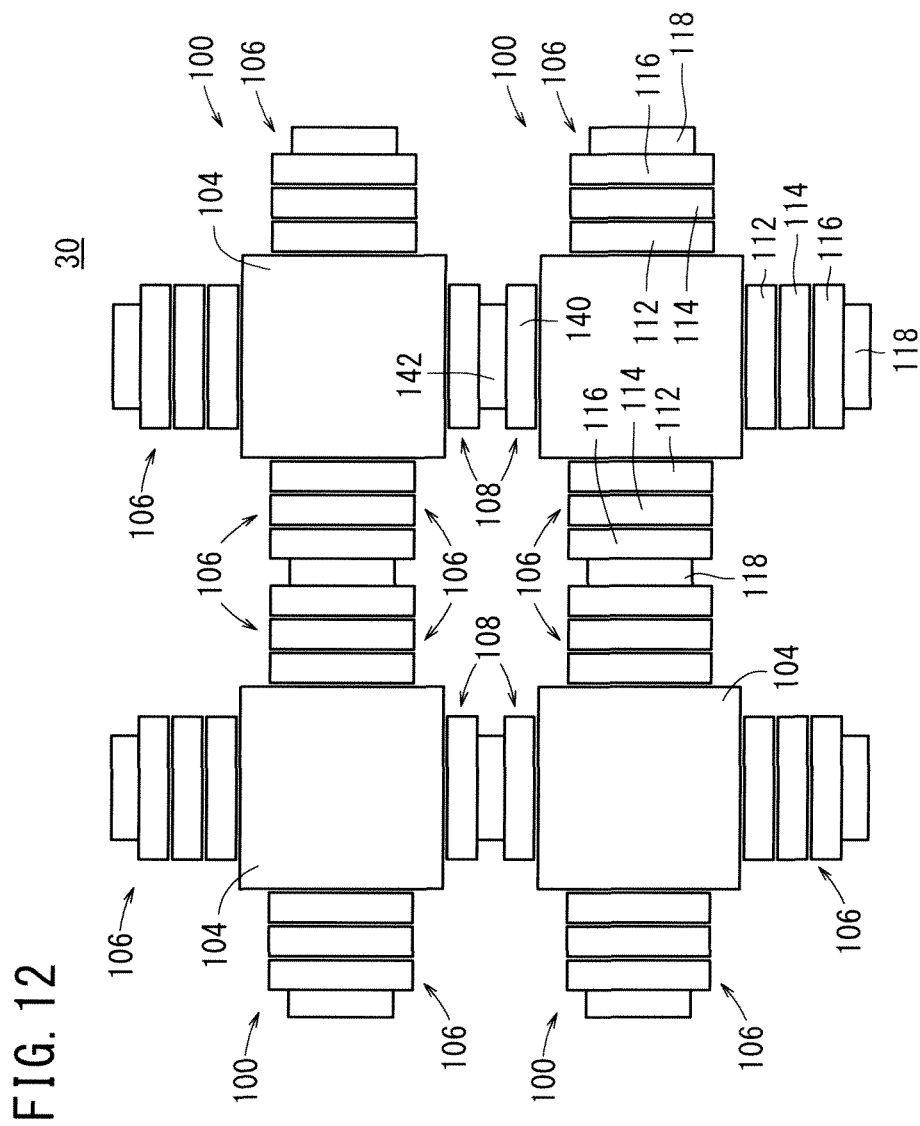
FIG. 12 is a plan view of another unit pixel different from that of FIG. 4.

FIG. 12 is a plan view of another unit pixel 30 different form that of FIG. 4. The same components are marked with the same numerals in FIGS. 4 and 12. The unit pixel 30 has four light receiving devices 100 arranged in a matrix. The light receiving device 100 has one photoelectric conversion element 104, three photoelectron distributors 106, and one photoelectron discharger 108. Two of the three photoelectron distributors 106 are arranged in the horizontal direction symmetrically with respect to the photoelectric conversion element 104, and the other one is formed on the top or bottom of the photoelectric conversion element 104. The photoelectron discharger 108 is formed on the bottom or top of the photoelectric conversion element 104, on which the photoelectron distributor 106 is not formed. In the two upper light receiving devices 100 in the unit pixel 30, the photoelectron distributor 106 is formed on the top of the photoelectric conversion element 104, and the photoelectron discharger 108 is formed on the bottom. In the two lower light receiving devices 100 in the unit pixel 30, the photoelectron distributor 106 is formed on the bottom of the photoelectric conversion element 104, and the photoelectron discharger 108 is formed on the top. In the structure of the unit pixel 30, the light receiving devices 100 adjacent to each other in the vertical direction share a diffusion layer 142 formed therebetween. Furthermore, in the unit pixel 30, the light receiving devices 100 adjacent to each other in the horizontal direction share a floating diffusion layer 118 formed therebetween.

Thus, the unit pixel 30 has the four light receiving devices 100 arranged in a matrix, the light receiving device 100 has the three photoelectron distributors 106, two of the three photoelectron distributors 106 are arranged in the horizontal direction symmetrically with respect to the photoelectric conversion element 104, the other photoelectron distributor 106 is formed on the top or bottom of the photoelectric conversion element 104, and the light receiving devices 100 adjacent to each other in the horizontal direction share the floating diffusion layer 118 formed therebetween. Therefore, the unit pixel 30 can be miniaturized and the chip area can be reduced, whereby the costs for the unit pixel 30 can be reduced and the resolution of the unit pixels 30 can be increased.

Figure 13:
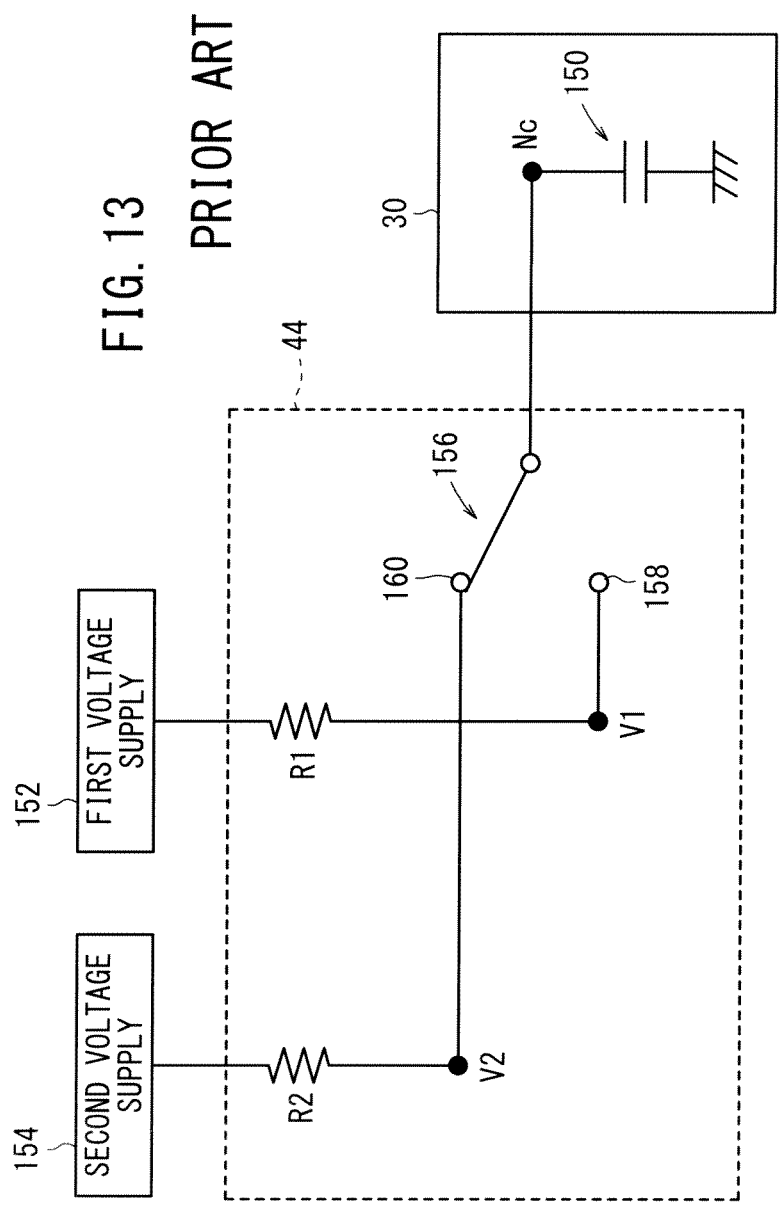
FIG. 13 is a structural view of a main part of a conventional gate drive circuit.

Then, the gate drive circuit 44 of this embodiment for supplying the gate drive signal to the unit pixel 30 will be described below. A conventional gate drive circuit 44 will be described prior to the explanation of the gate drive circuit 44 of this embodiment. FIG. 13 is a structural view of a main part of the conventional gate drive circuit 44.

In FIG. 13, the reference numeral 150 represents a pixel load capacitance. The pixel load capacitance 150 is a parasitic capacitance formed by an MOS diode structure in the unit pixel 30. The pixel load capacitance 150 is formed in the gate such as the photogate 110, the first transfer gate 120, the hold gate 122, the second transfer gate 124, the third transfer gate 144, or the gate of the reset transistor 126 of the above embodiment.

A first voltage supply 152 supplies a first voltage (first signal voltage) to the unit pixel 30, and a second voltage supply 154 supplies a second voltage (second signal voltage) to the unit pixel 30. The gate drive circuit 44 has a change-over switch 156 for selectively switching a voltage (signal voltage) applied to the unit pixel 30.

Specifically, the gate drive circuit 44 further has a first contact point 158 connected to the first voltage supply 152 for supplying the first voltage (first signal voltage) to the gate of the pixel load capacitance 150 and a second contact point 160 connected to the second voltage supply 154 for supplying the second voltage (second signal voltage) to the gate of the pixel load capacitance 150. The change-over switch 156 is connected to one of the first contact point 158 and the second contact point 160 to select the first or second voltage to be applied to the gate of the pixel load capacitance 150.

The first voltage supply 152 applies a reference voltage (e.g. 0 V) to the unit pixel 30, and is a ground in this embodiment. The second voltage supply 154 applies the second voltage higher than the first voltage to the unit pixel 30. Both the first voltage supply 152 and the second voltage supply 154 are mounted in the power source 20 in this embodiment. In FIG. 13, $R_1$ represents a wiring resistance between the first voltage supply 152 and the first contact point 158, and $R_2$ represents a wiring resistance between the second voltage supply 154 and the second contact point 160.

In the operation of driving the unit pixel 30, the first and second voltages are alternately applied to the gate of the pixel load capacitance 150 in the unit pixel 30, whereby a pulse gate drive signal (pixel drive signal) is applied to the unit pixel 30. For example, when the photoelectric conversion element 104 in the unit pixel 30 is driven to generate the photoelectrons, when the first transfer unit 112 is driven to transfer the photoelectrons, when the photoelectron hold unit 114 is driven to hold the photoelectrons, when the second transfer unit 116 is driven to transfer the photoelectrons, when the third transfer unit 140 is driven to transfer the photoelectrons, and when the reset transistor 126 is driven to reset the photoelectrons in the floating diffusion layer 118, the first and second voltages are alternately supplied from the gate drive circuit 44 to the photogate 110, the first transfer gate 120, the hold gate 122, the second transfer gate 124, the third transfer gate 144, and the gate of the reset transistor 126, respectively. In the operation of driving the unit pixel 30, the processes of generating, transferring, holding, discharging, and resetting the photoelectrons are performed. In addition, all the unit pixels 30 in the pixel array 32 are simultaneously driven by the gate drive circuit 44, whereby the processes of generating, transferring, holding, discharging, and resetting the photoelectrons are simultaneously performed (the global shutter operation is performed).

Figure 14:
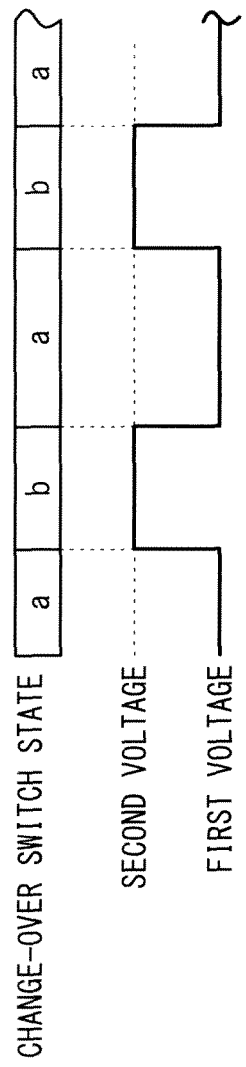
FIG. 14 is a waveform diagram of an ideal voltage applied to a gate of a pixel load capacitance by the gate drive circuit of FIG. 13.

FIG. 14 is a waveform diagram of an ideal voltage applied to the gate of the pixel load capacitance 150 by the gate drive circuit 44 of FIG. 13. In FIG. 14, the change-over switch 156 is connected to the first contact point 158 in the state "a", and the change-over switch 156 is connected to the second contact point 160 in the state "b". When the change-over switch 156 is connected to the first contact point 158 in the gate drive circuit 44, the voltage $V_C$ applied to the gate of the pixel load capacitance 150 is switched to the first voltage. Then, the change-over switch 156 is connected to the second contact point 160, whereby the voltage $V_C$ is switched to the second voltage. Furthermore, the change-over switch 156 is connected to the first contact point 158 again, whereby the voltage $V_C$ is switched to the first voltage. The first and second voltages are alternately applied by the gate drive circuit 44 to the gates of the pixel load capacitances 150 in all the unit pixels 30 in the pixel array 32 in this manner, so that the gate drive signal of pulse signal is applied to the pixel load capacitances 150 to simultaneously perform the processes of generating, transferring, holding, discharging, and resetting the photoelectrons in the unit pixels 30.

Figure 15:
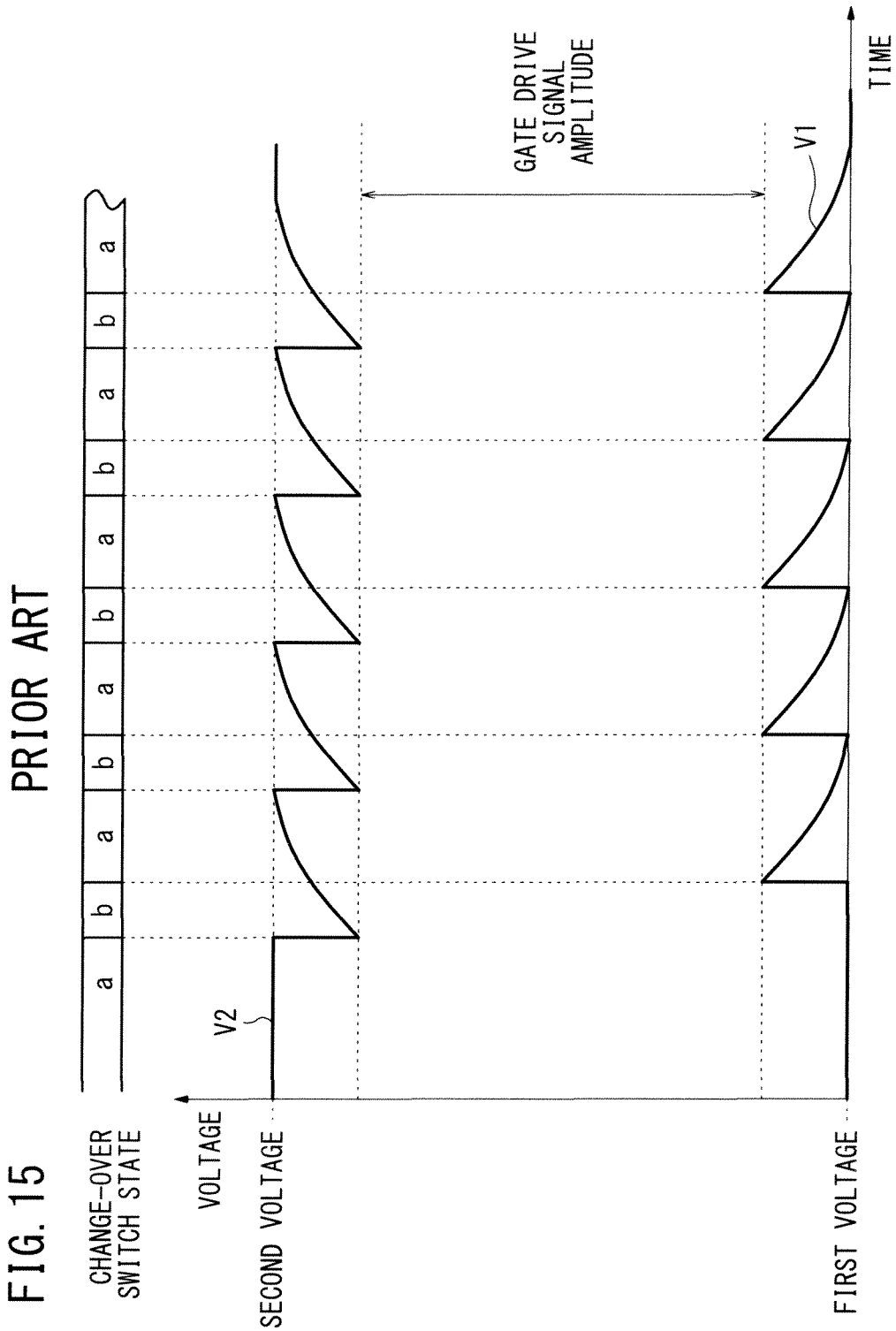
FIG. 15 is a waveform diagram of the voltages of first and second contact points in the process of applying a practical voltage to the gate of the pixel load capacitance by the gate drive circuit of FIG. 13.

However, when the contact of the change-over switch 156 is switched from the first contact point 158 to the second contact point 160 (when the voltage applied to the gate of the pixel load capacitance 150 is switched from the first voltage to the second voltage), the voltage $V_2$ of the second contact point 160 is not immediately switched to the second voltage as shown in FIG. 15. Therefore, also the voltage $V_C$ applied to the gate of the pixel load capacitance 150 (the voltage of the node $N_C$) is not immediately switched to the second voltage and is not sharply raised.

When the contact of the change-over switch 156 is switched from the first contact point 158 to the second contact point 160, the voltage $V_2$ of the second contact point 160 is not immediately switched to the second voltage for the following reason. When the contact of the change-over switch 156 is switched to the second contact point 160, a current (peak current) rapidly flows from the second voltage supply 154 to the pixel load capacitance 150. Therefore, the wiring resistance $R_2$ causes voltage drop, whereby the voltage $V_2$ of the second contact point 160 is rapidly lowered. Then, the voltage $V_C$ of the pixel load capacitance 150 gradually varies toward the second voltage as the pixel load capacitance 150 is charged up, the current flowing in the pixel load capacitance 150 is reduced in accordance therewith, the voltage drop degree is reduced, and the voltage $V_2$ of the second contact point 160 approaches the second voltage. When the second contact point 160 is connected to the pixel load capacitance 150 by the change-over switch 156, the voltage $V_C$ applied to the gate of the pixel load capacitance 150 (the voltage of the node $N_C$) depends on the voltage $V_2$.

Furthermore, when the contact of the change-over switch 156 is switched from the second contact point 160 to the first contact point 158 (when the voltage applied to the gate of the pixel load capacitance 150 is switched from the second voltage to the first voltage), the voltage $V_1$ of the first contact point 158 is not immediately switched to the first voltage as shown in FIG. 15. Therefore, also the voltage $V_C$ applied to the gate of the pixel load capacitance 150 is not immediately switched to the first voltage, and the gate drive signal is not sharply dropped.

When the contact of the change-over switch 156 is switched from the second contact point 160 to the first contact point 158, the voltage $V_1$ of the first contact point 158 is not immediately switched to the first voltage for the following reason. When the contact of the change-over switch 156 is switched to the first contact point 158, the node $N_C$ of the pixel load capacitance 150 is connected to the first contact point 158, and the voltage $V_1$ of the first contact point 158 is rapidly increased due to the voltage of the node $N_C$. Then, a current flows from the pixel load capacitance 150 through the wiring resistance $R_1$ to the first voltage supply (ground) 152, the pixel load capacitance 150 is discharged, and the voltage $V_1$ of the first contact point 158 is gradually lowered and then reaches the first voltage. When the first contact point 158 is connected to the pixel load capacitance 150 by the change-over switch 156, the voltage $V_C$ applied to the gate of the pixel load capacitance 150 depends on the voltage $V_1$.

Figure 16:
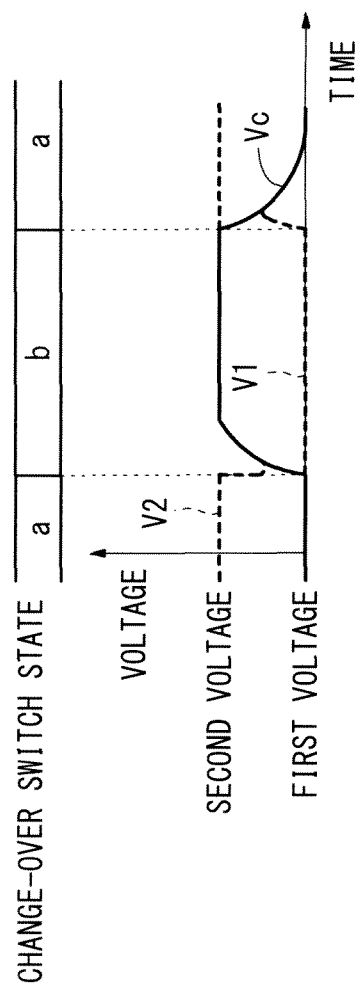
FIG. 16 is a waveform diagram of a voltage applied to the gate of the pixel load capacitance by the gate drive circuit of FIG. 13.

FIG. 16 is a waveform diagram of the voltage $V_C$ applied to the gate of the pixel load capacitance 150 by the gate drive circuit 44 of FIG. 13. In FIG. 16, the switching cycle time of the change-over switch 156 is longer than that of FIG. 15 to exaggeratingly show the decrease in the voltage $V_2$ of the second contact point 160 and the increase in the voltage $V_1$ of the first contact point 158 due to the voltage drop by the wiring resistance $R_2$. As described above, when the contact of the change-over switch 156 is switched from the first contact point 158 to the second contact point 160, the current (peak current) rapidly flows from the second voltage supply 154 toward the pixel load capacitance 150, the wiring resistance $R_2$ causes the voltage drop, and the gate drive signal applied to the pixel load capacitance 150 is not sharply raised. As described above, when the contact of the change-over switch 156 is switched from the second contact point 160 to the first contact point 158, the voltage $V_1$ of the first contact point 158 is rapidly increased due to the voltage $V_C$ of the node $N_C$, and the gate drive signal applied to the gate of the pixel load capacitance 150 is not sharply dropped.

Thus, the pixel load capacitance 150 cannot be instantly charged and discharged, the gate drive signal applied to the pixel load capacitance 150 cannot be sharply raised and dropped, the gate drive signal cannot be applied to the gate of the pixel load capacitance 150 as desired, and the global shutter operation cannot be performed at high speed. In addition, the amplitude of the gate drive signal applied to the pixel load capacitance 150 (the voltage $V_2$–the voltage $V_1$) is reduced to adversely affect the pixel driving operation (see FIG. 15).

Figure 17:
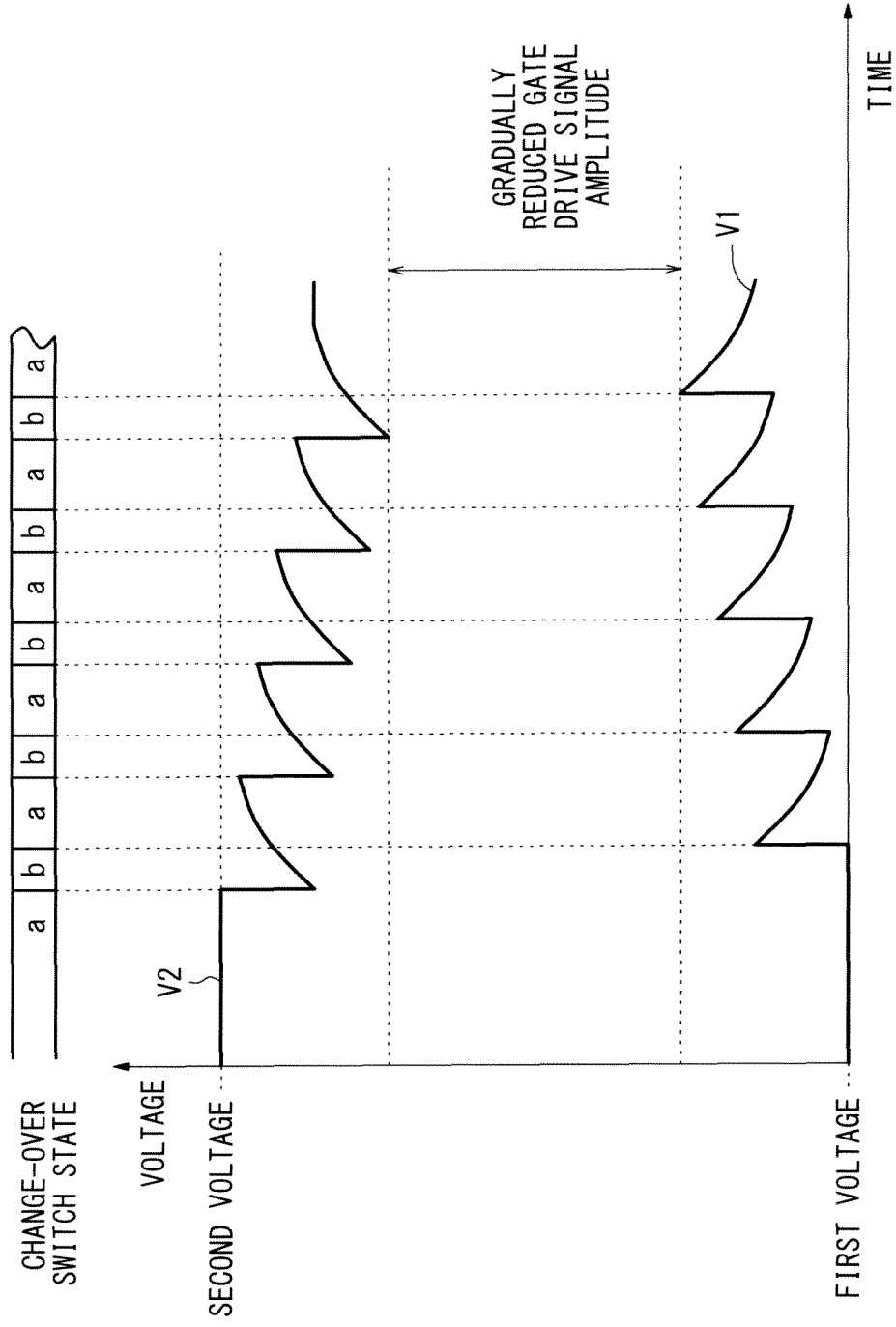
FIG. 17 is a waveform diagram of the voltages of the first and second contact points in the process of applying a practical voltage to the gate of the pixel load capacitance by the gate drive circuit of FIG. 13 in a global shutter operation.

When the contact of the change-over switch 156 is switched from the first contact point 158 to the second contact point 160, the voltage $V_2$ of the second contact point 160 is rapidly lowered and then gradually changed toward the second voltage. As shown in FIG. 17, in a case where the change-over switch 156 is successively switched at high speed (where the global shutter operation is repeatedly performed at high speed), the contact of the change-over switch 156 is switched from the first contact point 158 to the second contact point 160 before the voltage $V_2$ of the second contact point 160 reaches the second voltage. Therefore, the voltage drop is accumulated, whereby the voltage $V_2$ of the second contact point 160 is further lowered. Thus, as the contact of the change-over switch 156 is repeatedly switched from the first contact point 158 to the second contact point 160, the voltage $V_2$ of the second contact point 160 is further lowered.

Also when the contact of the change-over switch 156 is switched from the second contact point 160 to the first contact point 158, the same problem is caused. In the case where the change-over switch 156 is successively switched at high speed, the contact of the change-over switch 156 is switched from the second contact point 160 to the first contact point 158 before the voltage $V_1$ of the first contact point 158 reaches the first voltage. Therefore, the voltage rise is accumulated, whereby the voltage $V_1$ of the first contact point 158 is further increased. Thus, as the contact of the change-over switch 156 is repeatedly switched from the second contact point 160 to the first contact point 158, the voltage $V_1$ of the first contact point 158 is further increased. Consequently, the amplitude of the gate drive signal applied to the pixel load capacitance 150 is gradually further reduced to adversely affect the pixel driving operation.

Figure 18:
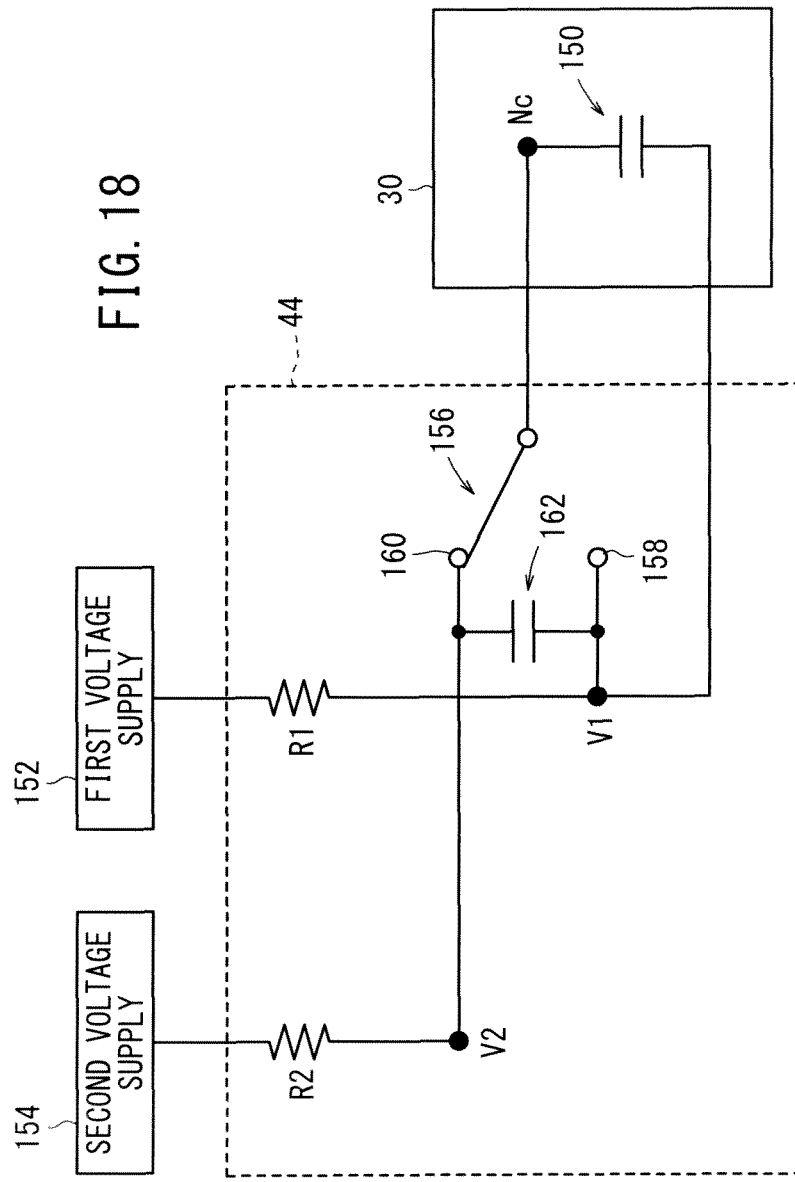
FIG. 18 is a structural view of a main part of a gate drive circuit according to the embodiment.

Accordingly, as shown in FIG. 18, in the gate drive circuit 44 of this embodiment, a capacitor (first capacitor) 162 is located between the first contact point 158 and the second contact point 160. The insulator side (lower side) of the pixel load capacitance 150 is connected to the first contact point 158, and the upper side is connected to the change-over switch 156. The capacitor 162 is located adjacent to the outermost periphery of the pixel array 32. When the wiring length between terminals of the capacitor 162 and the gate of the pixel load capacitance 150 is minimized, the time constant (R×C) obtained from the wiring resistance and the wiring parasitic capacitance can be reduced, and the gate drive signal can be sharply raised and dropped.

Figure 19:
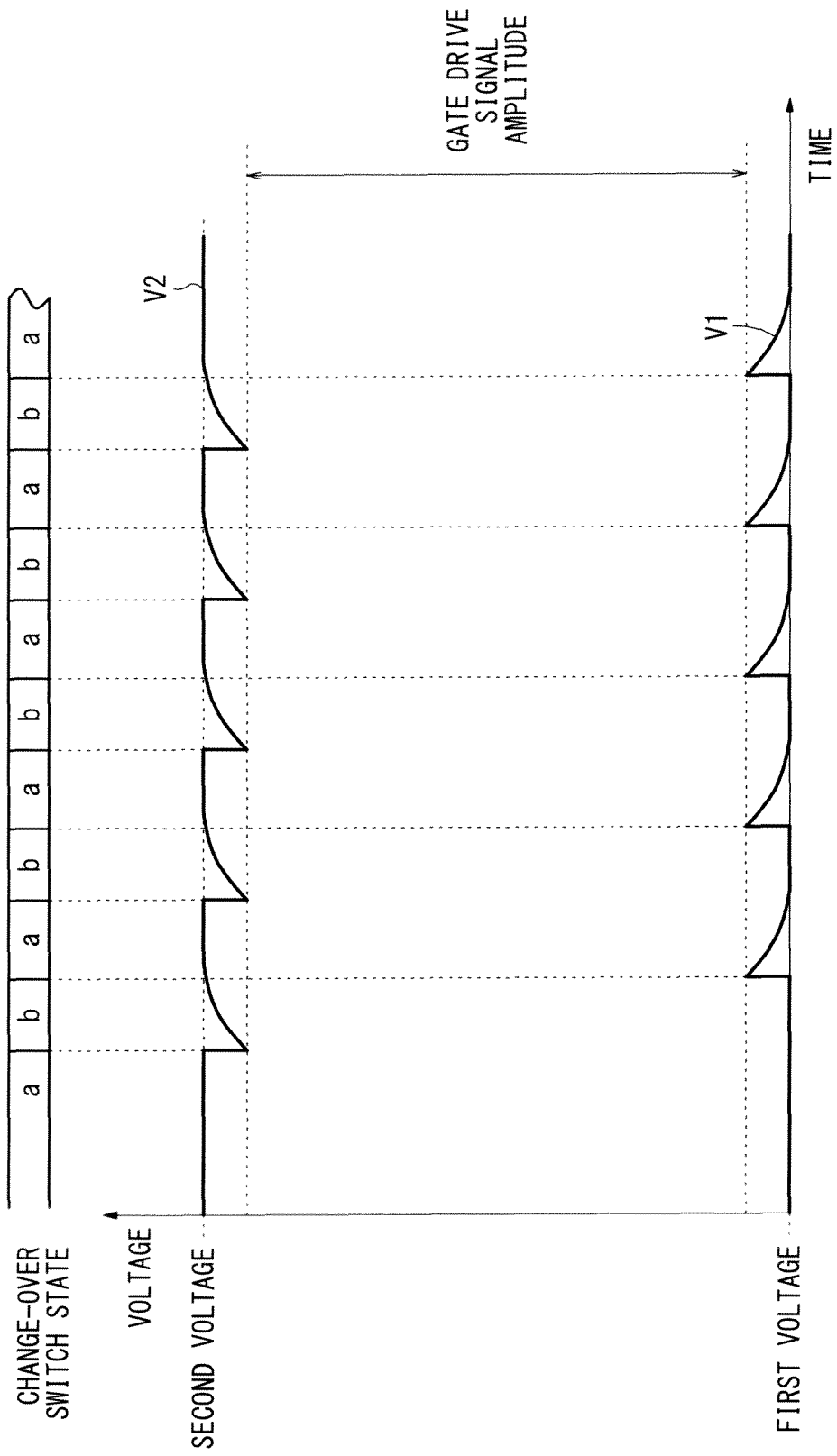
FIG. 19 is a waveform diagram of the voltages of first and second contact points in the process of applying a practical voltage to the gate of the pixel load capacitance by the gate drive circuit of FIG. 18.
Figure 20:
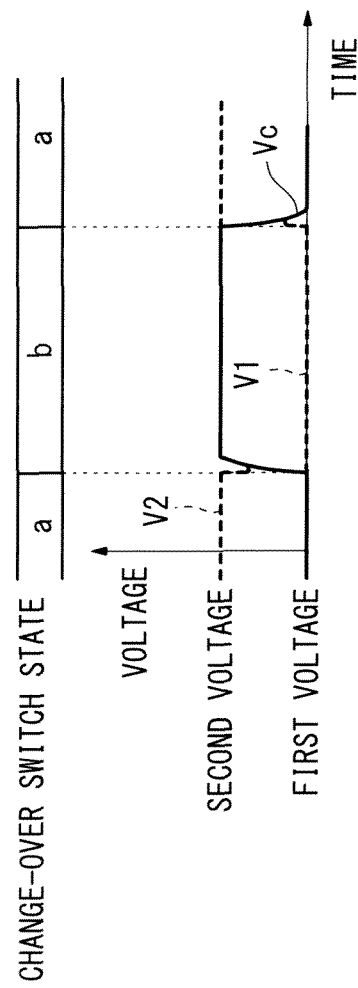
FIG. 20 is a waveform diagram of a voltage applied to the gate of the pixel load capacitance by the gate drive circuit of FIG. 18.

FIG. 19 is a waveform diagram of the voltages of the first contact point 158 and the second contact point 160 in the process of applying a practical voltage to the gate of the pixel load capacitance 150 by the gate drive circuit 44 of FIG. 18, and FIG. 20 is a waveform diagram of the voltage $V_C$ applied to the gate of the pixel load capacitance 150 by the gate drive circuit 44 of FIG. 18. In FIG. 20, the switching cycle time of the change-over switch 156 is longer than that of FIG. 19 to exaggeratingly show the decrease in the voltage $V_2$ of the second contact point 160 and the increase in the voltage $V_1$ of the first contact point 158 due to the voltage drop by the wiring resistance $R_2$.

As shown in FIG. 19, when the contact of the change-over switch 156 is switched from the first contact point 158 to the second contact point 160, the electric charge stored in the capacitor 162 is supplied to the gate of the pixel load capacitance 150. Therefore, the pixel load capacitance 150 can be instantly charged up, and the decrease in the voltage $V_2$ of the second contact point 160 can be reduced. Thus, the gate drive signal can be more sharply raised.

Furthermore, when the contact of the change-over switch 156 is switched from the second contact point 160 to the first contact point 158, the gate of the pixel load capacitance 150 and the insulator are connected to the first contact point 158. Therefore, the electric charge stored in the pixel load capacitance 150 can be instantly discharged, the increase of the voltage $V_1$ of the first contact point 158 can be reduced, and the time required to lower the voltage $V_1$ to the first voltage can be shortened.

Thus, the pixel load capacitance 150 can be instantly charged and discharged in this manner, the gate drive signal applied to the pixel load capacitance 150 can be sharply raised and dropped, and the gate drive signal can be applied to the gate of the pixel load capacitance 150 as desired. As a result, the global shutter operation can be performed at high speed. In addition, the amplitude of the gate drive signal supplied to the pixel load capacitance 150 can be increased to improve the pixel driving accuracy.

Figure 21:
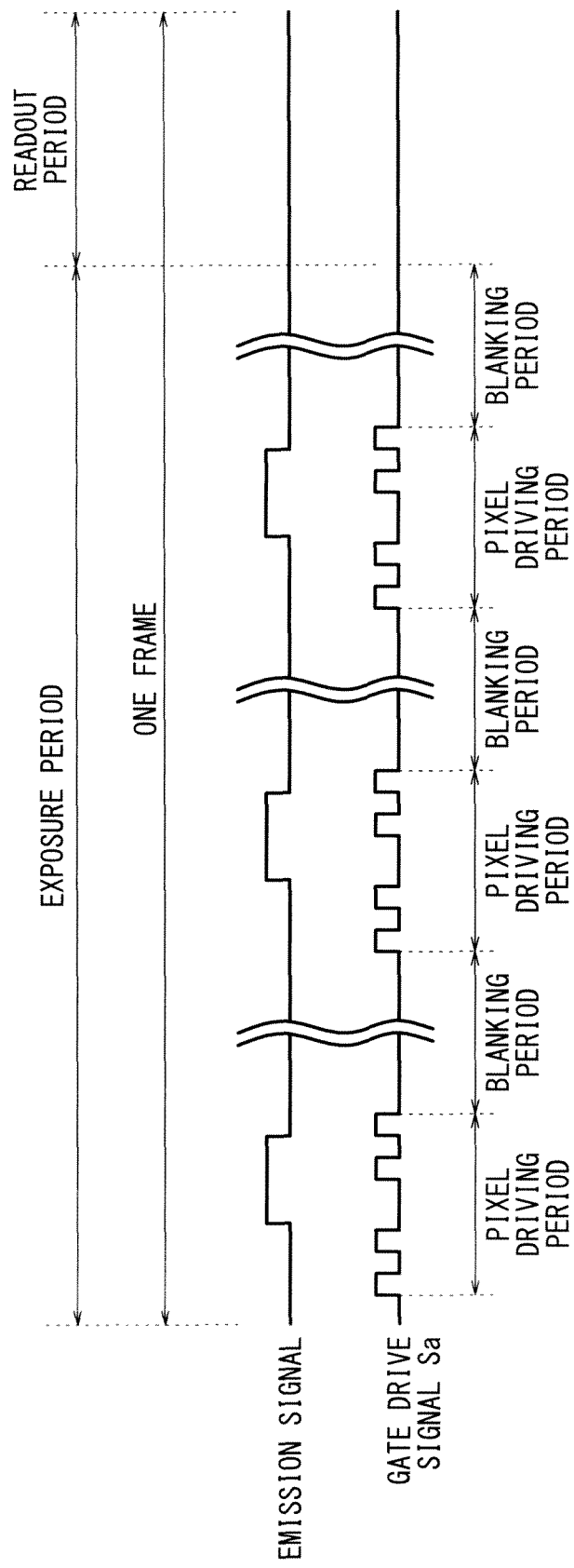
FIG. 21 is a view for illustrating periods for driving the pixel load capacitance.

Then, periods for driving the pixel load capacitance 150 will be described below with reference to FIG. 21. An example of the pixel load capacitance 150 formed in the photogate 110 of the photoelectric conversion element 104 is shown in FIG. 21. As shown in FIG. 21, the one frame includes an exposure period and a readout period. The photoelectric conversion element 104 detects the light and stores the photoelectrons generated by the light in the exposure period, and the photoelectrons obtained in the exposure period are read out from the signal read line 132 in the readout period.

The exposure period includes a plurality of pixel driving periods and a plurality of blanking periods repeated alternately. The gate drive signal Sa is supplied to the photogate 110 (the pixel load capacitance 150) in the photoelectric conversion element 104 to practically generate the photoelectrons in the pixel driving period, and the gate drive signal Sa is not supplied to the photogate 110 in the photoelectric conversion element 104 in the blanking period. In the pixel driving period, an emission signal is supplied to the light emitter 24 in the irradiation unit 12 to drive the light emitter 24, the emitted light Le is irradiated onto the target object W, and the photoelectric conversion element 104 is driven to detect the light. The gate drive signal Sa is supplied from the gate drive circuit 44 to the photoelectric conversion element 104 such that the light-receiving process of the photoelectric conversion element 104 in the above described four periods of the former and latter first light-receiving periods and the former and latter second light-receiving periods are carried out in the pixel driving period.

Specifically, the change-over switch 156 is driven by the gate drive circuit 44 such that the second voltage is applied to the photogate 110 in the photoelectric conversion element 104 in the first and second light-receiving periods while the first voltage is applied to the photogate 110 in the periods other than the first and second light-receiving periods. Thus, the gate drive signal of pulse signal is supplied in the pixel driving period. Incidentally, the light emitter 24 emits the light during a period when a high emission signal is being supplied.

For example, the photoelectrons generated in the former first light-receiving period are held in the photoelectron hold unit 114 of the photoelectron distributor 106a, the photoelectrons generated in the latter first light-receiving period are held in the photoelectron hold unit 114 of the photoelectron distributor 106b, the photoelectrons generated in the former second light-receiving period are held in the photoelectron hold unit 114 of the photoelectron distributor 106c, and the photoelectrons generated in the latter second light-receiving period are held in the photoelectron hold unit 114 of the photoelectron distributor 106d.

In the blanking period, the change-over switch 156 is connected to the first contact point 158, the second voltage is applied from the second voltage supply 154 to the capacitor 162, whereby the capacitor 162 is charged up. The electric charge stored in the capacitor 162 is discharged in the pixel driving period, and the capacitor 162 is charged in the blanking period, so that the voltage of the first contact point 158 of the capacitor 162 is controlled to the first voltage, and the voltage of the second contact point 160 of the capacitor 162 is controlled to the second voltage. The pixel driving period is the discharge period of the capacitor 162, and the blanking period is the charge period of the capacitor 162. Thus, the capacitor 162 can be in the charged state when the contact of the change-over switch 156 is switched from the first contact point 158 to the second contact point 160, and the decrease in the voltage $V_2$ of the second contact point 160 can be reduced in the pixel driving period.

The photoelectrons, which are generated by the light incident on the photoelectric conversion element 104 in the periods other then the first and second light-receiving periods, are discharged through the third transfer unit 140 from the diffusion layer 142 under the discharge signal Se input from the gate drive circuit 44 to the third transfer gate 144. Though the pixel load capacitance 150 is formed in the photogate 110 of the photoelectric conversion element 104 in the above example, the pixel load capacitance 150 may be formed in the gate other than the photogate 110 (such as the hold gate 122 of the photoelectron hold unit 114). Also in this case, the pixel driving period and the blanking period are used for the pixel load capacitance 150.

The above embodiment may be modified as follows.

Modified Example 1

Figure 22:
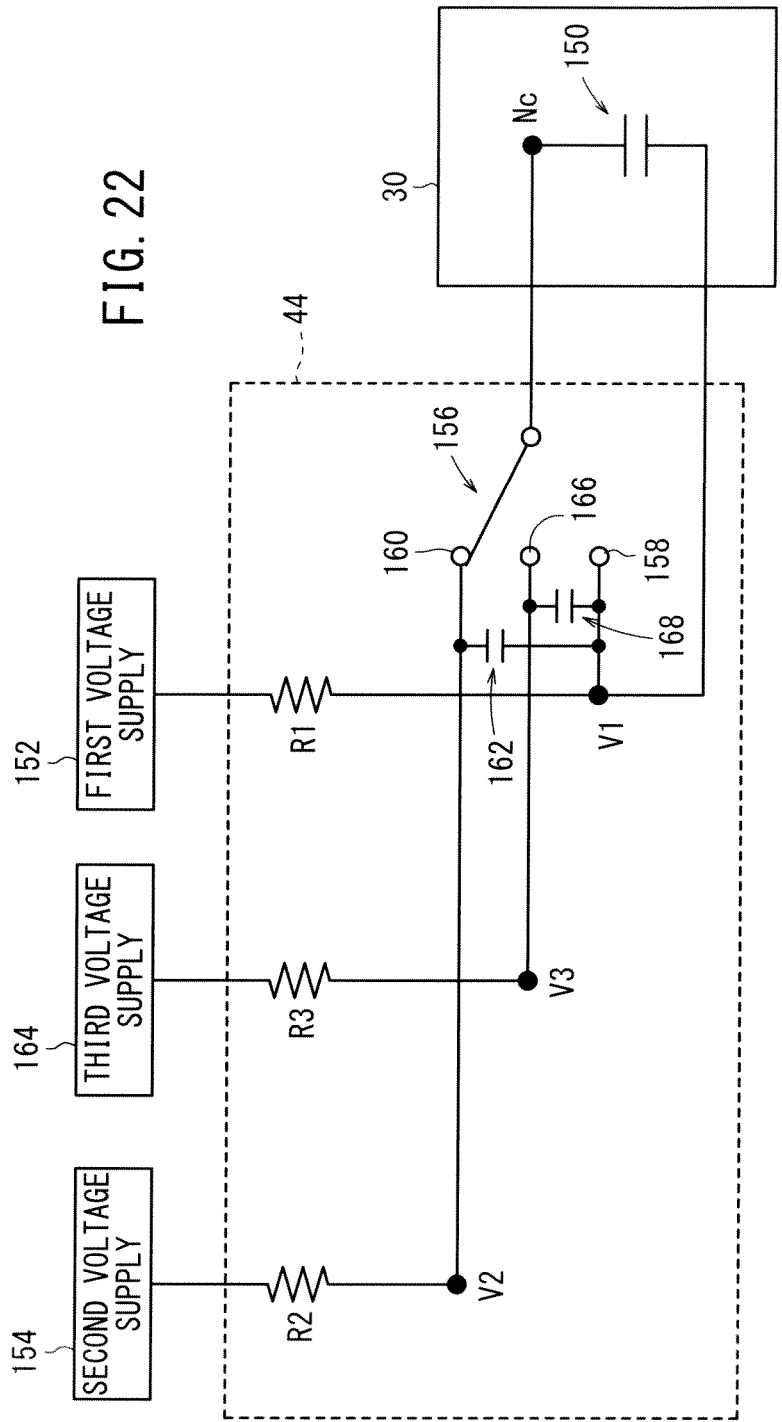
FIG. 22 is a structural view of a main part of a gate drive circuit according to Modified Example 1.

In Modified Example 1, the gate drive circuit 44 has a structure shown in FIG. 22. Thus, in Modified Example 1, the gate drive circuit 44 has a third contact point 166 connected to a third voltage supply (intermediate voltage supply) 164 for applying a third voltage to the gate of the pixel load capacitance 150 in the unit pixel 30, and further has a capacitor (second capacitor) 168 between the first contact point 158 and the third contact point 166. The change-over switch 156 acts to selectively apply the first, second, and third voltages to the gate of the pixel load capacitance 150. The third voltage is an intermediate voltage (intermediate signal voltage) higher than the first voltage and lower than the second voltage. The third voltage supply 164 is mounted in the power source 20. In FIG. 22, $R_3$ represents a wiring resistance between the third voltage supply 164 and the third contact point 166. The same components are marked with the same numerals in FIGS. 18 and 22. The capacitor 168 is located adjacent to the outermost periphery of the pixel array 32.

Figure 23:
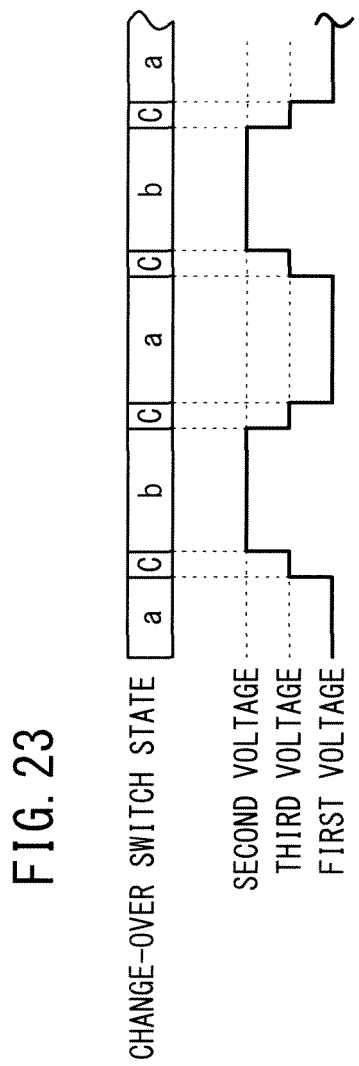
FIG. 23 is a waveform diagram of an ideal voltage applied to the gate of the pixel load capacitance by the gate drive circuit of FIG. 22.

FIG. 23 is a waveform diagram of an ideal voltage applied to the gate of the pixel load capacitance 150 by the gate drive circuit 44 of FIG. 22. In FIG. 23, the change-over switch 156 is connected to the third contact point 166 in the state "c". In this example, when the change-over switch 156 is connected to the first contact point 158 by the gate drive circuit 44, the voltage $V_C$ applied to the gate of the pixel load capacitance 150 (the voltage of the node NJ is switched to the first voltage. Next, the change-over switch 156 is connected to the third contact point 166, whereby the voltage $V_C$ applied to the gate of the pixel load capacitance 150 is switched to the third voltage. Subsequently, the change-over switch 156 is connected to the second contact point 160, whereby the voltage $V_C$ is switched to the second voltage. Then, the change-over switch 156 is connected to the third contact point 166 again, whereby the voltage $V_C$ applied to the gate of the pixel load capacitance 150 is switched to the third voltage. Furthermore, the change-over switch 156 is connected to the first contact point 158 again, whereby the voltage $V_C$ is switched to the first voltage. Thus, the first and second voltages are alternately applied by the gate drive circuit 44 to the pixel load capacitances 150 in all the unit pixels 30 in the pixel array 32, and the third voltage is applied in the processes of switching the voltage from the first voltage to the second voltage and from the second voltage to the first voltage. Therefore, the gate drive signal of approximately pulsed signal is applied to the pixel load capacitances 150 to simultaneously perform the processes of generating, transferring, discharging, and resetting the photoelectrons in the unit pixels 30.

Figure 24:
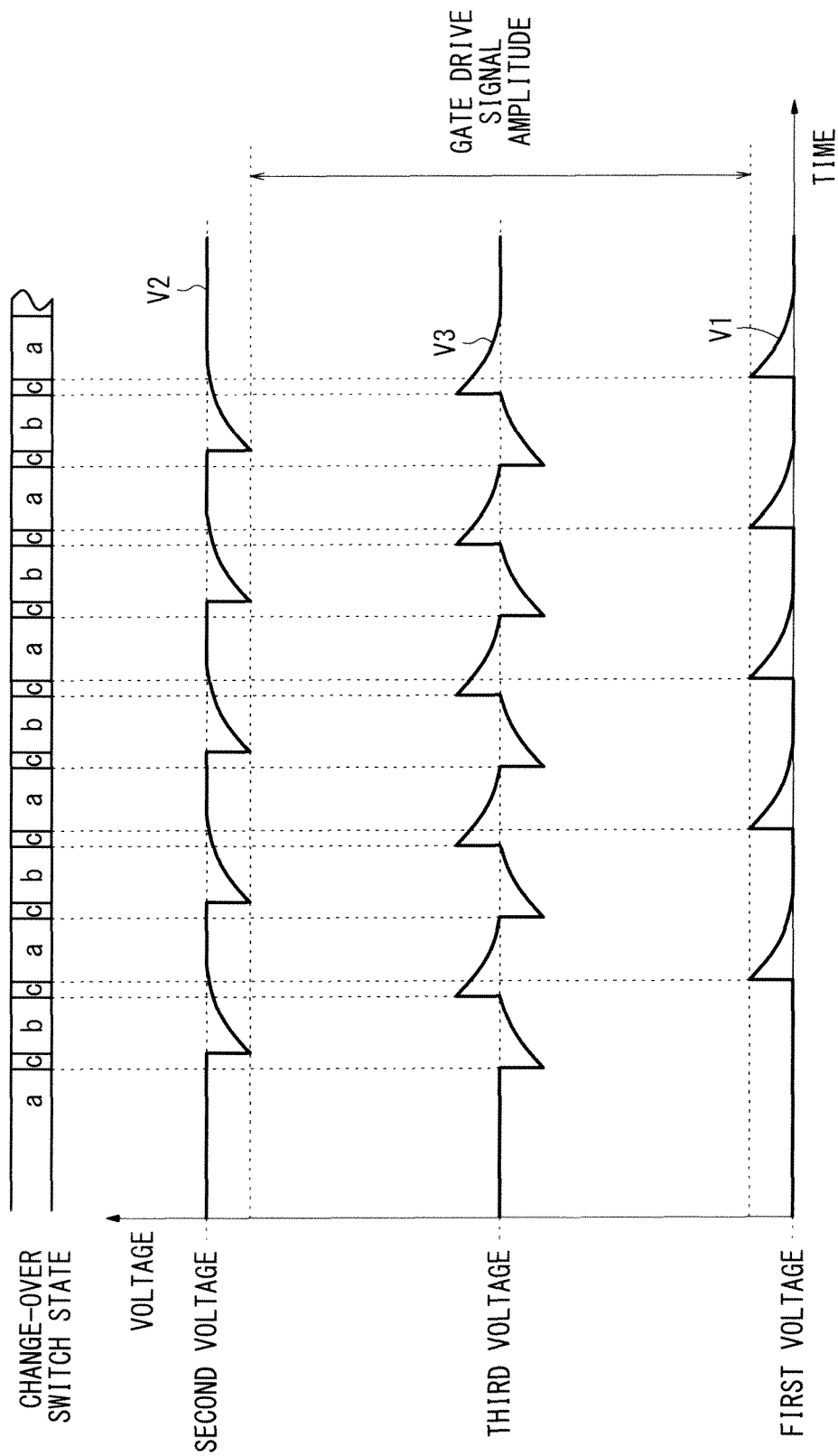
FIG. 24 is a waveform diagram of the voltages of first, second, and third contact points in the process of applying a practical voltage to the gate of the pixel load capacitance by the gate drive circuit of FIG. 18.

As shown in FIG. 24, in the process of switching the first contact point 158 to the second contact point 160, the change-over switch 156 is connected to the third contact point 166 in the above manner, whereby the decrease in the voltage $V_2$ of the second contact point 160 is further reduced due to the discharge of the capacitor 162 as compared with the example of FIG. 19 even after the contact of the change-over switch 156 was switched to the second contact point 160. In the process of switching the contact of the change-over switch

156 from the first contact point 158 to the second contact point 160, the change-over switch 156 is connected to the third contact point 166, a current (electric charge) is supplied from the capacitor 168 to the pixel load capacitance 150, the pixel load capacitance 150 is charged up to a certain extent, and then the change-over switch 156 is connected to the second contact point 160. Therefore, the current (electric charge) flowing from the capacitor 162 to the pixel load capacitance 150 is reduced as compared with the example of FIG. 19. Thus, even when the change-over switch 156 is connected to the second contact point 160, the decrease in the voltage $V_2$ of the second contact point 160 can be reduced.

When the contact of the change-over switch 156 is switched from the first contact point 158 to the third contact point 166, a current (electric charge) flows from the capacitor 168 to the pixel load capacitance 150, so that the voltage $V_3$ of the third contact point 166 is lowered and then gradually increased to the third voltage. When the contact of the change-over switch 156 is switched from the second contact point 160 to the third contact point 166, the voltage $V_3$ of the third contact point 166 is increased, a current (electric charge) flows from the pixel load capacitance 150 through the wiring resistance $R_3$ to the third voltage supply 164, so that the voltage $V_3$ of the third contact point 166 is lowered to the third voltage.

When the capacitor 162 and the capacitor 168 are disposed between the first contact point 158 and the second contact point 160 and between the first contact point 158 and the third contact point 166 in this manner, the pixel load capacitance 150 can be instantly charged and discharged, the gate drive signal applied to the pixel load capacitance 150 can be sharply raised and dropped, and the gate drive signal can be applied to the gate of the pixel load capacitance 150 as desired. Since the pixel load capacitance 150 is charged and discharged in the two steps, the amount of the electric charge supplied from the second voltage supply 154 to the pixel load capacitance 150 can be reduced, whereby the decrease in the voltage $V_2$ of the second contact point 160 due to the discharge of the capacitor 162 can be reduced.

Thus, the pulse signal (gate drive signal) of a voltage approximately equal to the desired voltage can be applied to the gate of the pixel load capacitance 150, so that the global shutter operation can be performed at high speed. Furthermore, the amplitude of the gate drive signal supplied to the pixel load capacitance 150 can be increased to improve the pixel drive accuracy.

In addition, in the process of switching the contact of the change-over switch 156 from the first contact point 158 to the second contact point 160, the time required to convert the voltage $V_2$ of the second contact point 160 to the second voltage can be shortened. Therefore, even when the global shutter operation is repeatedly performed at high speed, the decrease in the voltage $V_2$ of the second contact point 160 due to the accumulated voltage drop can be reduced. It should be noted that the capacitor 168 is charged in the blanking period, the voltage of the first contact point 158 of the capacitor 168 is controlled at the first voltage, and the voltage of the third contact point 166 of the capacitor 168 is controlled at the third voltage.

The third voltage may be selected such that the potential difference between the third and first voltages is equal to that between the second and third voltages. In this case, the electric charge flowing to the third contact point 166 and the electric charge flowing from the third contact point 166 are balanced out, whereby the voltage of the third contact point 166 can be stably maintained.

Modified Example 2

Though the unit pixel 30 has the four light receiving devices 100 in the above embodiment, the unit pixel 30 may have only one light receiving device 100 or a plurality of light receiving devices 100 (e.g. two, three, or five light receiving devices 100). Furthermore, though the light receiving device 100 has the four photoelectron distributors 106 in the above examples, the light receiving device 100 may have only one photoelectron distributor 106 or a plurality of photoelectron distributors 106 (e.g. two, three, or five photoelectron distributors 106).

In addition, though the change-over switch 156, the first contact point 158, the second contact point 160, and a third contact point 166 are formed in the gate drive circuit 44 in the above examples, they may be formed outside the gate drive circuit 44.

Although the present invention has been described with reference to the above embodiment, the scope of the invention is not limited to the embodiment. It will be apparent to those skilled in the art that various changes and modifications may be made to the embodiment without departing from the scope of the invention as set forth in the appended claims.

What is claimed is:

1. A solid-state image sensing device comprising:
   a unit pixel containing a photoelectric conversion element for detecting a light to generate photoelectrons and at least one electrode for forming an MOS diode structure;
   a first contact point connected to a first voltage supply for supplying a first voltage to the electrode;
   a second contact point connected to a second voltage supply for supplying a second voltage higher than the first voltage to the electrode;
   a first capacitor disposed between the first contact point and the second contact point;
   a change-over switch, which is connected to one of the first contact point and the second contact point to selectively switch a voltage applied to the electrode to the first voltage or the second voltage;
   pixel drive circuits for driving the change-over switch, thereby alternately applying the first voltage and the second voltage to the electrode to generate, hold, transfer, reset, or discharge the photoelectrons;
   a third contact point connected to a third voltage supply for supplying a third voltage higher than the first voltage and lower than the second voltage to the electrode; and
   a second capacitor disposed between the first contact point and the third contact point;
   wherein the pixel drive circuits control the change-over switch to apply the third voltage to the electrode in the processes of switching the voltage applied to the electrode from the first voltage to the second voltage and from the second voltage to the first voltage.

2. The solid-state image sensing device according to claim 1, wherein the unit pixel contains a first transfer unit for transferring the photoelectrons generated in the photoelectric conversion element, a photoelectron hold unit located on one side of the photoelectric conversion element with the first transfer unit interposed therebetween for temporarily holding the photoelectrons generated in the photoelectric conversion element, a second transfer unit located on one side of the first transfer unit with the photoelectron hold unit interposed therebetween for transferring the photoelectrons held in the photoelectron hold unit, a floating diffusion layer located on one side of the photoelectron hold unit with the second transfer unit interposed therebetween for converting the transferred photoelectrons to a voltage, a reset transistor for resetting a potential of the floating diffusion layer to a reference potential, and a photoelectron discharger for discharging the photoelectrons generated in the photoelectric conversion element, and at least one of the photoelectric conversion element, the first transfer unit, the photoelectron hold unit, the second transfer unit, the reset transistor, and the photoelectron discharger has the MOS diode structure.

3. The solid-state image sensing device according to claim 1, further comprising a pixel array containing a plurality of unit pixels arranged one- or two-dimensionally, wherein the pixel drive circuits control the voltage applied to the at least one electrode for forming the MOS diode structure to simultaneously generate, hold, transfer, reset, or discharge the photoelectrons.

4. The solid-state image sensing device according to claim 3, wherein the first capacitor is located adjacent to an outermost periphery of the pixel array.

5. The solid-state image sensing device according to claim 1, wherein voltages of the first contact point and the second contact point of the first capacitor are controlled to the first voltage and the second voltage respectively, and the voltages of the first contact point and the third contact point of the second capacitor are controlled to the first voltage and the third voltage respectively, in a blanking period.

6. The solid-state image sensing device according to claim 1, wherein a voltage is applied to an upper side of the electrode, and a lower side of the electrode is wire-connected to the first contact point inside the solid-state image sensing device and further wire-connected to the first voltage supply via the first contact point.

\* \* \* \* \*